US009711349B2

(12) United States Patent
Hanaoka et al.

(10) Patent No.: US 9,711,349 B2
(45) Date of Patent: Jul. 18, 2017

(54) PROCESSING METHOD OF STACKED-LAYER FILM AND MANUFACTURING METHOD OF SEMICONDUCTOR DEVICE

(71) Applicant: SEMICONDUCTOR ENERGY LABORATORY CO., LTD., Atsugi-shi, Kanagawa-ken (JP)

(72) Inventors: Kazuya Hanaoka, Kanagawa (JP); Shinya Sasagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/678,134

(22) Filed: Apr. 3, 2015

(65) Prior Publication Data

US 2015/0214041 A1    Jul. 30, 2015

Related U.S. Application Data

(62) Division of application No. 13/854,564, filed on Apr. 1, 2013, now Pat. No. 8,999,773.

(30) Foreign Application Priority Data

Apr. 5, 2012 (JP) ................................. 2012-086279

(51) Int. Cl.
  *H01L 29/10* (2006.01)
  *H01L 21/02* (2006.01)
  (Continued)

(52) U.S. Cl.
  CPC .. *H01L 21/02244* (2013.01); *H01L 21/02107* (2013.01); *H01L 21/02323* (2013.01);
  (Continued)

(58) Field of Classification Search
  CPC ............. H01L 27/1225; H01L 29/7869; H01L 29/7872; H01L 29/78693
  (Continued)

(56) References Cited

U.S. PATENT DOCUMENTS 5,528,032 A    6/1996 Uchiyama
5,731,856 A    3/1998 Kim et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Brook Kebede
(74) *Attorney, Agent, or Firm* — Fish & Richardson P.C.

(57) ABSTRACT

In a processing method of a stacked-layer film in which a metal film is provided on an oxide insulating film, plasma containing an oxygen ion is generated by applying high-frequency power with power density greater than or equal to 0.59 W/cm$^2$ and less than or equal to 1.18 W/cm$^2$ to the stacked-layer film side under an atmosphere containing oxygen in which pressure is greater than or equal to 5 Pa and less than or equal to 15 Pa, the metal film is oxidized by the oxygen ion, and an oxide insulating film containing excess oxygen is formed by supplying oxygen to the oxide insulating film.

15 Claims, 22 Drawing Sheets

(51) Int. Cl.
*H01L 29/66* (2006.01)
*H01L 29/786* (2006.01)
*H01L 27/1156* (2017.01)

(52) U.S. Cl.
CPC .... *H01L 21/02521* (2013.01); *H01L 27/1156* (2013.01); *H01L 29/66742* (2013.01); *H01L 29/66969* (2013.01); *H01L 29/7869* (2013.01); *H01L 21/02252* (2013.01)

(58) Field of Classification Search
USPC ................................. 257/43; 438/149–156
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,115,533 B2 | 10/2006 | Hayashi et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,314,806 B2 | 1/2008 | Choi et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,488,655 B2 | 2/2009 | Hayashi et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,034,179 B2 | 10/2011 | Kabe et al. | |
| 8,237,166 B2 | 8/2012 | Kumomi et al. | |
| 8,377,744 B2 | 2/2013 | Yamazaki et al. | |
| 8,410,474 B2 | 4/2013 | Okai et al. | |
| 8,878,173 B2 | 11/2014 | Yamazaki | |
| 9,449,991 B2 | 9/2016 | Yamazaki | |
| 2001/0046027 A1 | 11/2001 | Tai et al. | |
| 2002/0047148 A1 | 4/2002 | Won et al. | |
| 2002/0056838 A1 | 5/2002 | Ogawa | |
| 2002/0132454 A1 | 9/2002 | Ohtsu et al. | |
| 2003/0113972 A1 | 6/2003 | Hayashi et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0127523 A1* | 6/2011 | Yamazaki ..................... 257/43 | |
| 2011/0136302 A1* | 6/2011 | Yamazaki et al. ............ 438/156 | |
| 2011/0212569 A1 | 9/2011 | Yamazaki et al. | |
| 2011/0237025 A1 | 9/2011 | Yamazaki | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0269266 A1 | 11/2011 | Yamazaki | |
| 2011/0281394 A1 | 11/2011 | Yamazaki | |
| 2011/0284844 A1* | 11/2011 | Endo ................ H01L 29/78603 257/57 |
| 2012/0132903 A1* | 5/2012 | Yamazaki ........... H01L 21/0242 257/43 |
| 2012/0146019 A1 | 6/2012 | Yamazaki et al. | |
| 2012/0149147 A1 | 6/2012 | Yamazaki et al. | |
| 2012/0175608 A1* | 7/2012 | Yamazaki ........... H01L 29/7869 257/43 |
| 2012/0252173 A1 | 10/2012 | Imoto et al. | |
| 2013/0161610 A1 | 6/2013 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-249497 A | 9/2003 |
| JP | 2004-103957 A | 4/2004 |
| JP | 2004-266263 A | 9/2004 |
| JP | 2004-273614 A | 9/2004 |
| JP | 2004-273630 A | 9/2004 |
| JP | 2004-273732 A | 9/2004 |
| JP | 2006-165528 A | 6/2006 |
| JP | 2009-188348 A | 8/2009 |
| JP | 2011-168473 A | 9/2011 |
| JP | 2012-009836 A | 1/2012 |
| JP | 2012-033908 A | 2/2012 |
| WO | WO-2004/114391 | 12/2004 |
| WO | WO-2011/145467 | 11/2011 |
| WO | WO-2012/002292 | 1/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission Am-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

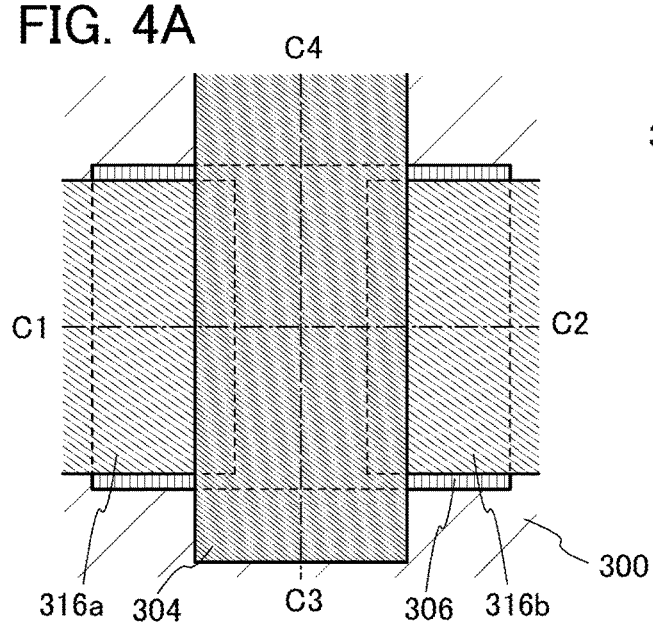
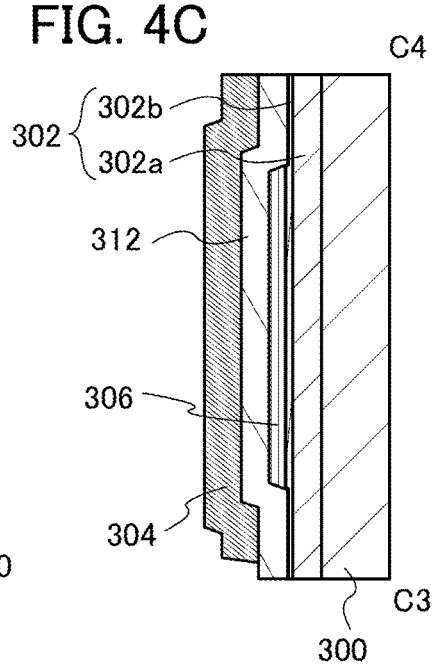
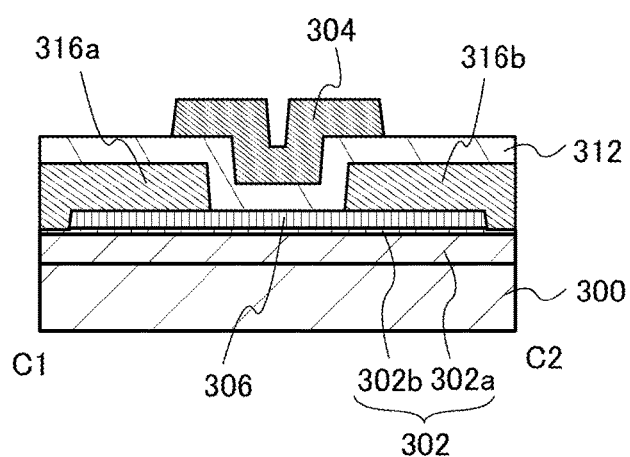

PROCESSING METHOD OF STACKED-LAYER FILM AND MANUFACTURING METHOD OF SEMICONDUCTOR DEVICE

CROSS-REFERENCE TO RELATED APPLICATIONS

This application is a divisional of U.S. application Ser. No. 13/854,564, filed Apr. 1, 2013, now allowed, which claims the benefit of a foreign priority application filed in Japan as Serial No. 2012-086279 on Apr. 5, 2012, both of which are incorporated by reference.

BACKGROUND OF THE INVENTION

1. Field of the Invention

The present invention relates to a stacked-layer film, a processing method of the stacked-layer film, semiconductor devices, and methods for manufacturing the semiconductor devices.

Note that in this specification, a semiconductor device refers to any device that can function by utilizing semiconductor characteristics, and an electro-optical device, a semiconductor circuit, an electronic device, and the like are all semiconductor devices.

In addition, the present invention relates to an object, a method, a method for producing an object, a process, a machine, manufacture, or a composition of matter. In particular, the present invention relates to, for example, a semiconductor device, a memory device, a display device, a liquid crystal display device, a light-emitting device, a driving method thereof, or a manufacturing method thereof. Alternatively, the present invention relates to, for example, an electronic device including the semiconductor device, the display device, or the light-emitting device.

2. Description of the Related Art

A technique for forming a transistor by using a semiconductor film formed over a substrate having an insulating surface has attracted attention. The transistor is applied to a wide range of semiconductor devices such as an integrated circuit and a display device. A silicon film and the like are widely known as a semiconductor film applicable to the transistor.

Whether an amorphous silicon film or a polycrystalline silicon film is used as a semiconductor film of a transistor depends on the purpose. For example, for a transistor in a large-sized display device, an amorphous silicon film is preferably used because a technique for forming a large-sized substrate has been established. On the other hand, for a transistor in a high-performance display device in which driver circuits are formed over one substrate, a polycrystalline silicon film is preferably used because the transistor can have high field-effect mobility. As a method for forming a polycrystalline silicon film, heat treatment at a high temperature or laser beam treatment which is performed on an amorphous silicon film has been known.

Furthermore, in recent years, an oxide-based semiconductor film has attracted attention. For example, a transistor which includes an amorphous oxide semiconductor film containing indium, gallium, and zinc and having a carrier density less than $10^{18}/cm^3$ is disclosed (see Patent Document 1).

An oxide semiconductor film can be formed by a sputtering method, and thus can be used for a transistor in a large-sized display device. Since a transistor including an oxide semiconductor film has high field-effect mobility, the use of such a transistor can achieve a high-performance display device or integrated circuit in which driver circuits are formed over one substrate. In addition, there is an advantage that capital investment can be reduced because part of production equipment for a transistor including an amorphous silicon film can be retrofitted and utilized.

Further, in a transistor including an oxide semiconductor film, oxygen vacancies in the oxide semiconductor film may cause deterioration in electrical characteristics of the transistor. A technique of using an insulating film which releases oxygen by heating as a base insulating film and reducing oxygen vacancies in an oxide semiconductor film and an interface state between the base insulating film and the oxide semiconductor film by the oxygen released from the base insulating film is disclosed (see Patent Document 2).

Note that the size of transistors have steadily decreased by scaling law.

REFERENCE

Patent Document

[Patent Document 1] Japanese Published Patent Application No. 2006-165528
[Patent Document 2] Japanese Published Patent Application No. 2012-9836

SUMMARY OF THE INVENTION

With a miniaturization of the transistor, the thickness of each layer is reduced, so that shape defects easily occur by a slight difference in level. Therefore, yield may be decreased with the miniaturization of the transistor.

Further, a transistor does not have stable electrical characteristics in some cases by defects of a semiconductor film and its vicinity.

In particular, in a transistor including an oxide semiconductor film, electrical characteristics of a transistor may deteriorate by oxygen vacancies in the oxide semiconductor film.

As described above, it is known that the oxygen vacancies in the oxide semiconductor film can be reduced by using the insulating film which releases oxygen. Thus, one object is to provide a stacked-layer film containing excess oxygen (also referred to as oxygen in excess of the stoichiometric composition or oxygen existing between lattices).

Another object is to provide transistors with high yield by reducing the shape defects. Another object is to provide a transistor with stable electrical characteristics.

Another object is to provide a semiconductor device using the transistor.

Another object is to suppress a reduction in luminance. Another object is to reduce power consumption. Another object is to suppress a reduction in lifetime. Another object is to suppress a temperature increase. Another object is to improve a manufacturing yield. Another object is to reduce cost. Another object is to improve image quality. Another object is to provide a novel semiconductor device. Another object is to provide an excellent semiconductor device.

Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

One embodiment of the present invention is a processing method of a stacked-layer film in which a metal film is provided on an oxide insulating film, including the steps of generating plasma containing an oxygen ion by setting pressure greater than or equal to 5 Pa and less than or equal to 15 Pa and by applying high-frequency power with power density greater than or equal to 0.59 W/cm$^2$ and less than or equal to 1.18 W/cm$^2$ to the stacked-layer film side under an atmosphere containing oxygen, forming a metal oxide film by oxidizing the metal film by the oxygen ion, and forming an oxide insulating film containing excess oxygen by supplying oxygen to the oxide insulating film.

In the stacked-layer film according to one embodiment of the present invention, by the oxygen ion contained in the plasma, the metal film is oxidized and excess oxygen is supplied to the oxide insulating film. The oxidized metal film can have oxygen permeability. Note that the plasma is generated with high pressure and high power density, whereby oxygen can be sufficiently supplied to the oxide insulating film and removal of the metal film (metal oxide film) by the plasma can be prevented.

Another embodiment of the present invention is a method for manufacturing a semiconductor device, including the steps of forming a metal film over an oxide insulating film, generating plasma containing an oxygen ion under an atmosphere containing oxygen, forming a metal oxide film by oxidizing the metal film by the oxygen ion, forming an oxide insulating film containing excess oxygen by supplying oxygen to the oxide insulating film, forming an oxide semiconductor film over the metal oxide film, forming a gate insulating film over the oxide semiconductor film, and forming a gate electrode over the gate insulating film.

Another embodiment of the present invention is a method for manufacturing a semiconductor device, including the steps of forming a metal film over an oxide insulating film, generating plasma containing an oxygen ion under an atmosphere containing oxygen, forming a metal oxide film by oxidizing the metal film by the oxygen ion, forming an oxide insulating film containing excess oxygen by supplying excess oxygen to the oxide insulating film, forming a gate electrode over the metal oxide film, forming a gate insulating film over the gate electrode, and forming an oxide semiconductor film over the gate insulating film.

Note that the plasma is generated by setting pressure greater than or equal to 5 Pa and less than or equal to 15 Pa and applying high-frequency power with power density greater than or equal to 0.59 W/cm$^2$ and less than or equal to 1.18 W/cm$^2$ to the metal film side.

As the metal film, a simple substance film selected from magnesium, aluminum, yttrium, hafnium, and zirconium; a nitride film containing one or more kinds of the above substances; an oxide film containing one or more kinds of the above substances; or an alloy film containing one or more kinds of the above substances with a thickness greater than or equal to 3 nm and less than or equal to 15 nm is provided.

In the semiconductor device according to one embodiment of the present invention, oxygen is released from an oxide insulating film containing excess oxygen. The oxygen reaches an oxide semiconductor film through the oxidized metal film, whereby oxygen vacancies in the oxide semiconductor film which cause deterioration of electrical characteristics of the transistor can be reduced.

Further, dry etching rate or wet etching rate of the oxidized metal film can be slower than that of the oxide semiconductor film or the gate electrode under wide range. Therefore, the oxidized metal film functions as an etching protective film, so that shape defects which are generated when the oxide semiconductor film or the gate electrode is formed can be suppressed.

An oxide insulating film is formed over a substrate, a metal film is formed over the oxide insulating film, the metal film is oxidized by operation of plasma generated under an atmosphere containing oxygen, and oxygen is supplied to the oxide insulating film, whereby a stacked-layer film containing excess oxygen can be provided.

Further, dry etching rate or wet etching rate of the oxidized metal film included in the stacked-layer film can be slower than that of the oxide semiconductor film or the gate electrode under wide range. Therefore, shape defects do not easily occur and transistors having stable electrical characteristics can be provided with high yield.

Further, a semiconductor device including the transistor can be provided.

BRIEF DESCRIPTION OF THE DRAWINGS

In the accompanying drawings:

FIGS. 4A to 4C are a top view and cross-sectional views illustrating an example of a transistor according to one embodiment of the present invention;

DETAILED DESCRIPTION OF THE INVENTION

Figure 1A:
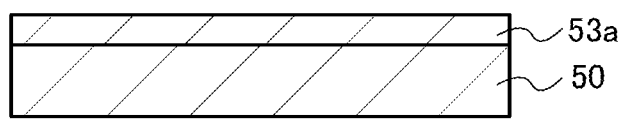
FIGS. 1A to 1C are cross-sectional views illustrating an example of a method for forming a stacked-layer film according to one embodiment of the present invention.

Embodiments of the present invention will be described in detail with reference to the accompanying drawings. Note that the present invention is not limited to the description below, and it is easily understood by those skilled in the art that modes and details disclosed herein can be modified in various ways. Further, the present invention is not construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases.

Note that what is described (or part thereof) in one embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with texts described in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Note that the size, the thickness of a layer, or a region in diagrams is sometimes exaggerated for simplicity. Therefore, embodiments of the present invention are not limited to such scales.

Note that diagrams are perspective views of ideal examples, and shapes or values are not limited to those illustrated in the diagrams. For example, the following can be included: variation in shape due to a manufacturing technique or dimensional deviation; or variation in signal, voltage, or current due to noise or difference in timing.

Note that a voltage refers to a potential difference between a certain potential and a reference potential (e.g., a ground potential (GND) or a source potential) in many cases. Accordingly, a voltage can also be called a potential.

Further, even when the expression "to be electrically connected" is used in this specification, there is a case in which no physical connection is made and a wiring is just extended in an actual circuit.

Note that technical terms are used in order to describe a specific embodiment, example, or the like in many cases. One embodiment of the present invention should not be construed as being limited by the technical terms.

Terms which are not defined in this specification (including terms used for science and technology, such as technical terms or academic terms) can be used as the terms having meaning equal to general meaning that an ordinary person skilled in the art understands. It is preferable that terms defined by dictionaries or the like be construed to have meanings consistent with the background of related art.

Note that the ordinal numbers such as "first" and "second" in this specification are used for convenience and do not denote the order of steps or the stacking order of layers. In addition, the ordinal numbers in this specification do not denote particular names which specify the present invention.

Note that a content which is not specified in any drawing or text in the specification can be excluded from the invention. When the number range of values indicated by e.g., the maximum value and the minimum value is described, the range may be freely narrowed or a value in the range may be excluded, so that the invention can be specified by a range resulting from exclusion of part of the range. In this manner, it is possible to specify the technical scope of the present invention so that a conventional technology is excluded, for example.

Specifically, for example, a diagram of a circuit including first to fifth transistors is described. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention. Note that, for example, it can be specified that the voltage is higher than or equal to 5 V and lower than or equal to 8 V in the invention. Note that, for example, it can be specified that the voltage is approximately 9 V in the invention. Note that, for example, it can be specified that the voltage is higher than or equal to 3 V and lower than or equal to 10 V but is not 9 V in the invention.

As another specific example, a description of a value, "a voltage is preferably 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention.

As another specific example, a description of a property of a material, "a film is an insulating film", is given. In that case, for example, it can be specified that the case where the insulating film is an organic insulating film is excluded from the invention. For example, it can be specified that the case where the insulating film is an inorganic insulating film is excluded from the invention.

As another specific example, a description of a stacked structure, "a film is provided between A and B" is given. In that case, for example, it can be specified that the case where the film is a stacked film of four or more layers is excluded from the invention. For example, it can be specified that the case where a conductive film is provided between A and the film is excluded from the invention.

Note that various people can implement the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. That is, one embodiment of the invention with which a patent infringement suit can be filed against Company A or Company B is clear and can be regarded as being disclosed in this specification or the like. For example, in the case of a transmission/reception system, one embodiment of the invention can be constituted by only a transmitting device and one embodiment of the invention can be constituted by only a receiving device. Those embodiments of the invention are clear and can be regarded as being disclosed in this specification or the like. As another example, in the case of a light-emitting device including a TFT and a light-emitting element, one embodiment of the invention can be constituted by only a semiconductor device including a TFT, and one embodiment of the invention can be constituted by only a light-emitting device including a TFT and a light-emitting element. Those embodiments of the invention are clear and can be regarded as being disclosed in this specification or the like.

Embodiment 1

In this embodiment, a stacked-layer film according to one embodiment of the present invention will be described.

Figure 1B:
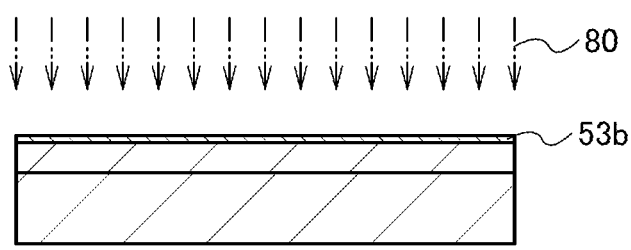
Figure 1C:
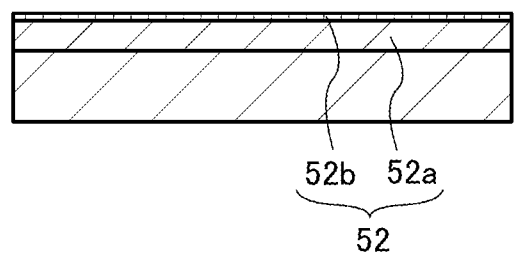

FIGS. 1A to 1C are cross-sectional views illustrating a method for forming the stacked-layer film according to an embodiment of the present invention.

First, an oxide insulating film 53a is formed over a substrate 50 (see FIG. 1A).

The oxide insulating film 53a may be formed of a single layer or a stacked layer using an insulating film including one or more of aluminum oxide, magnesium oxide, silicon oxide, silicon oxynitride, germanium oxide, yttrium oxide, zirconium oxide, lanthanum oxide, neodymium oxide, hafnium oxide, and tantalum oxide.

Note that, in this specification, silicon oxynitride refers to a substance that contains more oxygen than nitrogen, and silicon nitride oxide refers to a substance that contains more nitrogen than oxygen.

The oxide insulating film 53a can be deposited by a sputtering method, a chemical vapor deposition (CVD) method, a molecular beam epitaxy (MBE) method, an atomic layer deposition (ALD) method, or a pulsed laser deposition (PLD) method.

When a microwave CVD method is employed as the CVD method, plasma damage to a surface to be formed can be made small. Since high-density plasma is used, a dense film having fewer defects can be formed even at a relatively low temperature (at approximately 325° C.). Note that the microwave CVD method is also referred to as a high-density plasma CVD method. In this specification, a simple term "CVD method" includes a microwave CVD method and the like.

Next, a metal film 53b is formed. The metal film 53b may be formed with a thickness of 3 nm or more and 15 nm or less, preferably 5 nm or more and 10 nm or less.

The metal film 53b may be formed by a sputtering method, a CVD method, an MBE method, an ALD method, or a PLD method.

The metal film 53b may be formed of a single layer or a stacked layer of a simple substance selected from magnesium, aluminum, vanadium, chromium, yttrium, zirconium, niobium, lanthanum, cerium, neodymium, hafnium, tantalum, and tungsten; a nitride containing one or more kinds of the above substances; an oxide containing one or more kinds of the above substances; or an alloy containing one or more kinds of the above substances. The metal film 53b is preferably formed of a single layer or a stacked layer of a simple substance selected from magnesium, aluminum, yttrium, zirconium, and hafnium; a nitride containing one or more kinds of the above substances; an oxide containing one or more kinds of the above substances; or an alloy containing one or more kinds of the above substances.

Next, in an atmosphere containing oxygen, plasma is generated and the substrate 50 is exposed to ions 80 having an oxidation property in plasma (see FIG. 1B). The ions 80 are, for example, oxygen ions.

Plasma is generated by applying pressure greater than or equal to 5 Pa and less than or equal to 15 Pa (preferably, greater than or equal to 8 Pa and less than or equal to 12 Pa) and high-frequency power with power density greater than or equal to 0.59 W/cm$^2$ and less than or equal to 1.18 W/cm$^2$ (preferably, greater than or equal to 0.74 W/cm$^2$ and less than or equal to 1.03 W/cm$^2$) to the substrate 50 side. When plasma is generated under such a condition, self bias is added to the substrate 50 side and the ions 80 are drawn to the substrate 50 side.

The metal film 53b is oxidized by being exposed to the ions 80, so that a metal oxide film 52b is formed. Further, oxygen is added to the oxide insulating film 53a, so that an oxide insulating film containing excess oxygen (also referred to as oxygen in excess of the stoichiometric composition or oxygen existing between lattices) 52a is formed. In this manner, a stacked-layer film 52 including the oxide insulating film 52a and the metal oxide film 52b is formed (see FIG. 1C). Note that plasma is generated with high pressure and high power density, whereby oxygen can be sufficiently added to the oxide insulating film 53a (the oxide insulating film 52*a*) and removal of the metal film 53*b* (the metal oxide film 52*b*) by the plasma can be prevented.

By operation of the ions 80, the metal oxide film 52*b* can have a surface flatter than that of the metal film 53*b*. This is because, when the ions 80 collide with the surface of the metal film 53*b*, the metal film 53*b* is oxidized and the surface is sputtered. The narrower an incidence angle of the ions 80 is, the higher the sputtering rate of the sputtering by the ions 80 is. In the case where the ions 80 are incident in a direction perpendicular to the substrate 50, the incident angles of the ions 80 to projections are narrow; therefore, the projections are selectively etched. Therefore, proportion of a surface on which the incident angle of the ions 80 is narrow are decreased and proportion of a surface on which the incident angle of the ions 80 is wide (perpendicular to the surface) are increased. That is, a metal oxide film 52*b* having a flat surface can be obtained.

Specifically, the metal oxide film 52*b* can have an average surface roughness (Ra) of 1 nm or less, 0.3 nm or less, or 0.1 nm or less. Note that Ra is obtained by expanding center line average roughness (or arithmetic mean surface roughness) that is defined by JIS B 0601 (JIS B 0601: 2001 (ISO4287: 1997)), into three dimensions for application to a curved surface, and Ra can be expressed as the average value of the absolute values of deviations from a reference surface to a specific surface and is defined by Formula 1.

$$Ra = \frac{1}{S_0} \int_{y1}^{y2} \int_{x1}^{x2} |f(x, y) - Z_0| \, dx \, dy \qquad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

Here, oxygen can permeate the metal oxide film 52*b*. This is because the metal oxide film 52*b* contains oxygen less than the stoichiometric composition or in excess of the stoichiometric composition. By containing oxygen less than the stoichiometric composition or in excess of the stoichiometric composition, the metal oxide film 52*b* has a dangling bond and the metal oxide film 52*b* becomes active owing to the operation of the dangling bond. Thus, when oxygen reaches to an interface of the metal oxide film 52*b*, replacement of the oxygen is repeated like a billiard ball and oxygen can permeate the metal oxide film 52*b*. Alternatively, by containing oxygen less than the stoichiometric composition or in excess of the stoichiometric composition, distortion is generated. Spaces are formed by the distortion, so that density and crystallinity of the metal oxide film 52*b* are lowered. Oxygen can permeate the metal oxide film 52*b* through the spaces.

On the other hand, a heavy metal and the like having a large size does not easily permeate the metal oxide film 52*b*.

Further, the oxide insulating film 52*a* contains excess oxygen; thus, the oxide insulating film 52*a* can release oxygen by heat treatment or the like. Therefore, oxygen released from the oxide insulating film 52*a* is diffused outward through the metal oxide film 52*b*. That is, the stacked-layer film 52 has a function of releasing oxygen by the heat treatment.

Here, to release oxygen by heat treatment means that the amount of released oxygen which is converted into oxygen atoms is greater than or equal to $1 \times 10^{18}$ atoms/cm$^3$, greater than or equal to $1 \times 10^{19}$ atoms/cm$^3$, or greater than or equal to $1 \times 10^{20}$ atoms/cm$^3$ in thermal desorption spectroscopy (TDS) analysis.

Here, a method for measuring the amount of released oxygen using TDS analysis will be described.

The total amount of released gas from a measurement sample in TDS analysis is proportional to the integral value of the ion intensity of the released gas. Then, this integral value of the measurement sample is compared with the reference value of a standard sample, whereby the total amount of the released gas can be calculated.

For example, the number of released oxygen molecules ($N_{O2}$) from the measurement sample can be calculated according to Formula (2) using the TDS analysis results of a silicon wafer containing hydrogen at a predetermined density, which is the standard sample, and the TDS analysis results of the measurement sample. Here, all gasses having a mass number of 32 which are obtained by the TDS analysis are assumed to originate from an oxygen molecule. CH$_3$OH can be given as a gas having a mass number of 32, but is not taken into consideration on the assumption that CH$_3$OH is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \qquad \text{[FORMULA 2]}$$

$N_{H2}$ is the value obtained by conversion of the number of hydrogen molecules desorbed from the standard sample into density. $S_{H2}$ is the integral value of ion intensity when the standard sample is analyzed by TDS. Here, the reference value of the standard sample is expressed by $N_{H2}/S_{H2}$. $S_{O2}$ is the integral value of ion intensity when the measurement sample is analyzed by TDS, and $\alpha$ is a coefficient affecting the ion intensity in the TDS. For details of Formula (2), Japanese Published Patent Application No. H6-275697 is referred to. Note that the amount of released oxygen was measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Further, in the TDS, oxygen is partly detected as an oxygen atom. The ratio between oxygen molecules and oxygen atoms can be calculated from the ionization rate of oxygen molecules. Note that, since the above a is determined considering the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

Further, "releasing oxygen by the heat treatment" refers to "containing a peroxide radical". Specifically, the spin density attributed to a peroxide radical is $5 \times 10^{17}$ spins/cm$^3$ or higher. Note that "containing a peroxide radical" refers to "having a signal having asymmetry at a g value of around 2.01 in electron spin resonance (ESR)".

In the case where the metal oxide film 52b is an oxide film containing one or more of magnesium, aluminum, yttrium, zirconium, and hafnium, in particular, chemical stability is high, and thus, etching rate by dry etching and wet etching can be slowed down.

As described above, a stacked-layer film including a metal oxide film from which oxygen is released by the heat treatment and in which etching rate by dry etching and wet etching is slow can be formed. The stacked-layer film can be preferably used as a base film of a transistor including an oxide semiconductor film.

This embodiment shows an example of a basic principle. Thus, part or the whole of this embodiment can be freely combined with, applied to, or replaced with part or the whole of another embodiment.

Embodiment 2

In this embodiment, a transistor according to one embodiment of the present invention using the stacked-layer film described in Embodiment 1 will be described.

Figure 2A:
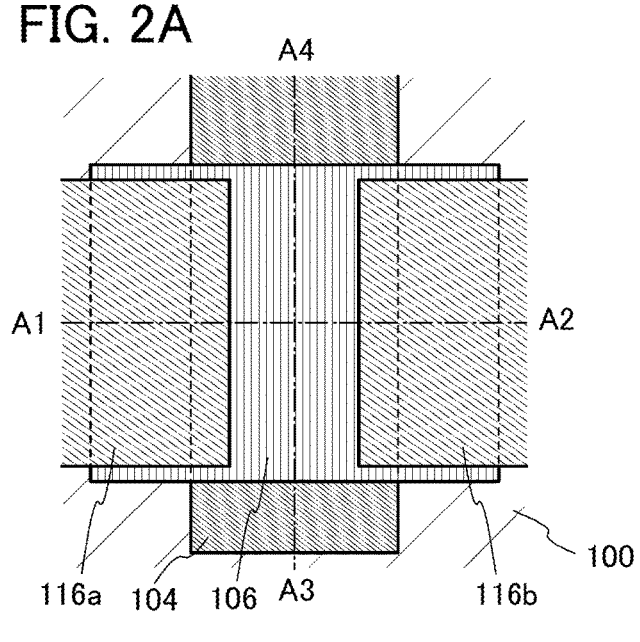
FIGS. 2A to 2C are a top view and cross-sectional views illustrating an example of a transistor according to one embodiment of the present invention.
Figure 2C:
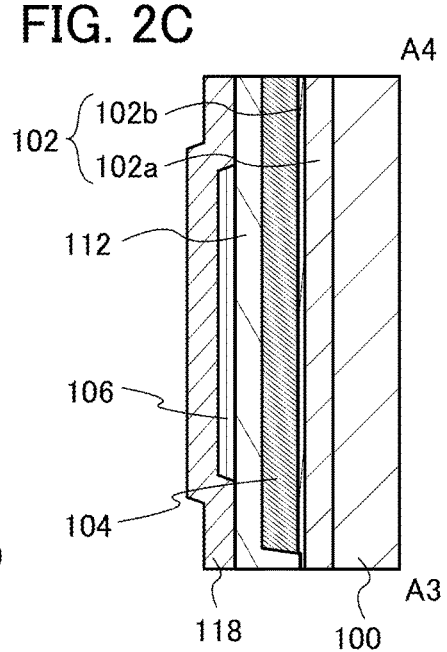
Figure 2B:
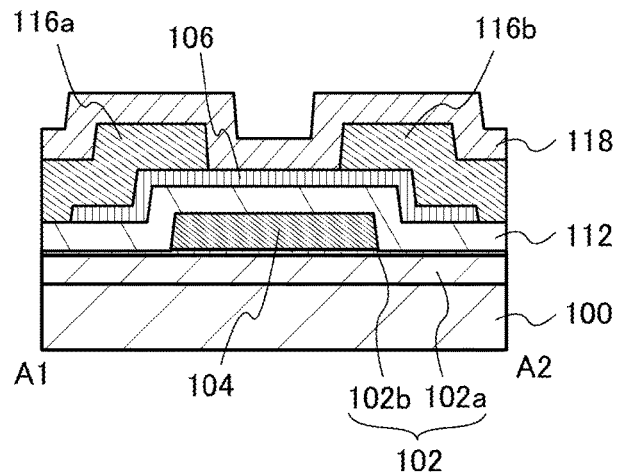

FIG. 2A is a top view of a transistor according to one embodiment of the present invention. FIG. 2B is a cross-sectional view along dashed-dotted line A1-A2 of FIG. 2A. FIG. 2C is a cross-sectional view taken along dashed-dotted line A3-A4 in FIG. 2A. Note that a gate insulating film 112 and the like are not illustrated in FIG. 2A for easy understanding.

FIG. 2B is a cross-sectional view of a transistor including a stacked-layer film 102 including an oxide insulating film 102a provided over a substrate 100 and a metal oxide film 102b provided over the oxide insulating film 102a, a gate electrode 104 provided over the stacked-layer film 102, a gate insulating film 112 provided over the gate electrode 104, an oxide semiconductor film 106 provided over the gate insulating film 112 and overlapping with the gate electrode 104, and a source electrode 116a and a drain electrode 116b provided over the oxide semiconductor film 106. Note that a protective insulating film 118 may be provided over the oxide semiconductor film 106, the source electrode 116a, and the drain electrode 116b.

The oxide insulating film 102a includes excess oxygen. Further, the metal oxide film 102b includes oxygen less than the stoichiometric composition or in excess of the stoichiometric composition.

A method for manufacturing the transistor illustrated in FIGS. 2A to 2C will be described with reference to FIGS. 8A to 8D and FIGS. 9A to 9C. Note that only cross-sectional views corresponding to FIG. 2B are shown for easy understanding in FIGS. 8A to 8D and FIGS. 9A to 9C.

First, the substrate 100 is prepared.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used as the substrate 100.

In the case of using a large glass substrate such as the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate which is unlikely to shrink through the heat treatment is preferably used. For example, a large-sized glass substrate which has a shrinkage of 10 ppm or less, preferably 5 ppm or less, more preferably 3 ppm or less after heat treatment at 400° C., preferably at 450° C., more preferably 500° C. for one hour may be used as the substrate 100.

Further alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

Figure 8A:
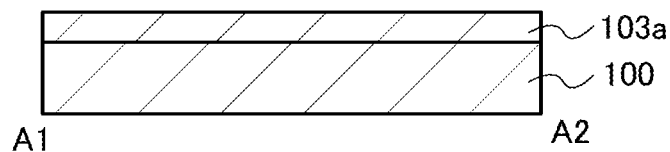
FIGS. 8A to 8D are cross-sectional views illustrating an example of a method for manufacturing the transistor illustrated in FIGS. 2A to 2C.

Next, the oxide insulating film 103a is formed over the substrate 100 (see FIG. 8A).

The oxide insulating film 103a may be formed using an insulating film and a method similar to those for the oxide insulating film 53a.

Next, the metal film 103b is formed. The metal film 103b may be formed with a thickness of 3 nm or more and 15 nm or less, preferably 5 nm or more and 10 nm or less.

The metal film 103b may be formed using a metal film and a method similar to those for the metal film 53b.

Figure 8B:
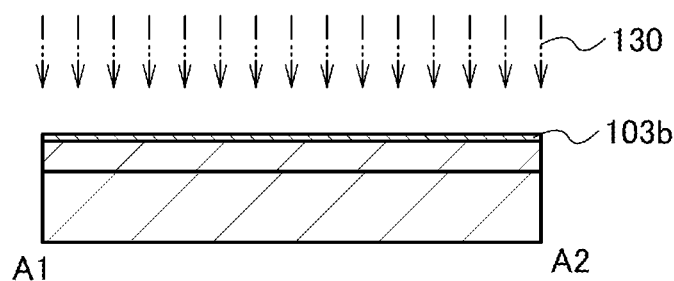

Next, in an atmosphere containing oxygen, plasma is generated and the substrate 100 is exposed to ions 130 having an oxidation property in plasma (see FIG. 8B). The ions 130 may be generated by a method similar to the ions 80.

The metal film 103b is oxidized by being exposed to the ions 130, so that a metal oxide film 102b is formed. Further, oxygen is added to the oxide insulating film 103a, so that an oxide insulating film containing excess oxygen 102a is formed. In this manner, a stacked-layer film 102 including the oxide insulating film 102a and the metal oxide film 102b is formed.

By operation of the ions 130, the metal oxide film 102b can have a surface flatter than that of the metal film 103b. This is because, when the ions 130 collide with the surface of the metal film 103b, the metal film 103b is oxidized and the surface is sputtered. The narrower an incidence angle of the ions 130 is, the higher the sputtering rate of the sputtering by the ions 130 is. In the case where the ions 130 are incident in a direction perpendicular to the substrate 100, the incident angles of the ions 130 to projections are narrow; therefore, the projections are selectively etched. Therefore, proportion of a surface on which the incident angle of the ions 130 is narrow are decreased and proportion of a surface on which the incident angle of the ions 130 is wide (perpendicular to the surface) are increased. That is, a metal oxide film 102b having a flat surface can be obtained.

Specifically, the stacked-layer film 102 can have Ra of 1 nm or less, 0.3 nm or less, or 0.1 nm or less.

As described above, the stacked-layer film 102 is formed using a stacked-layer film and a method similar to those for the stacked-layer film 52. Thus, the stacked-layer film 102 has a function similar to that of the stacked-layer film 52.

That is, oxygen can permeate the metal oxide film 102b.

Further, a heavy metal and the like having a large size does not easily permeate the metal oxide film 102b.

Further, the oxide insulating film 102a contains excess oxygen; thus, the oxide insulating film 102a can release oxygen by heat treatment or the like. Therefore, oxygen released from the oxide insulating film 102a is diffused outward through the metal oxide film 102b. That is, the stacked-layer film 102 has a function of releasing oxygen by the heat treatment.

Then, a conductive film to be the gate electrode 104 is formed.

The conductive film to be the gate electrode 104 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; and an alloy containing one or more kinds of the above substances. The conductive film to be the gate electrode 104 may be formed by a sputtering method, a CVD method, an MBE method, an ALD method, or a PLD method.

Figure 8C:
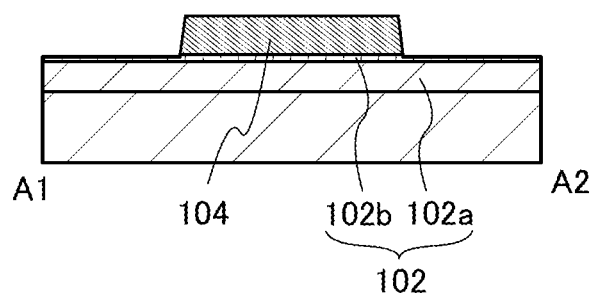

Next, the conductive film to be the gate electrode 104 is processed to form the gate electrode 104 (see FIG. 8C). At this time, the metal oxide film 102b is also etched; however, etching rate of the metal oxide film 102b is slow; thus, the metal oxide film 102b is only slightly etched. Therefore, shape defects are not easily generated by providing the stacked-layer film 102. That is, transistors can be manufactured with high yield. Note that unintended etching can occur in other steps; however, description of the etching is omitted for easy understanding.

Figure 8D:
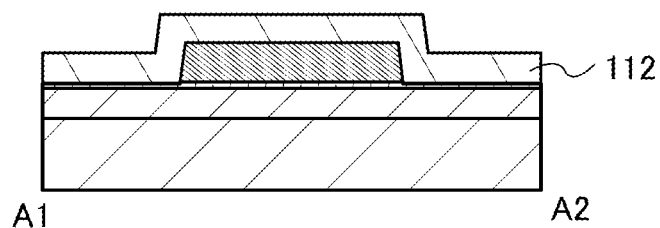

Next, the gate insulating film 112 is formed (see FIG. 8D).

The gate insulating film 112 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide. The gate insulating film 112 may be formed by a sputtering method, a CVD method, an MBE method, an ALD method, or a PLD method.

Then, an oxide semiconductor film to be the oxide semiconductor film 106 is formed.

As the oxide semiconductor film to be the oxide semiconductor film 106, for example, an In-M-Zn oxide may be used. Here, a metal element M is an element whose bond energy with oxygen is higher than that of In and that of Zn. Alternatively, the metal element M is an element which has a function of suppressing desorption of oxygen from the In-M-Zn oxide. Owing to the effect of the metal element M, generation of an oxygen vacancy in the oxide semiconductor film is suppressed. Note that oxygen vacancies in the oxide semiconductor film sometimes generate carriers. Therefore, the effect of the metal element M can suppress an increase in carrier density in the oxide semiconductor film and an increase in an off-state current. Furthermore, a change in the electrical characteristics of the transistor, which is caused by oxygen vacancies, can be reduced, whereby a highly reliable transistor can be obtained.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. The metal element M can be formed using one or more elements selected from the above elements. Further, Si or Ge may be used instead of the metal element M.

The hydrogen concentration in the oxide semiconductor film to be the oxide semiconductor film 106 is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$. This is because hydrogen included in the oxide semiconductor film sometimes generates unintentional carriers. The generated carriers might increase the off-state current of the transistor and vary the electrical characteristics of the transistor. Thus, when the hydrogen concentration in the oxide semiconductor film to be the oxide semiconductor film 106 is in the above range, an increase in the off-state current of the transistor and a change in the electrical characteristics of the transistor can be suppressed.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

An oxide semiconductor film to be the above-described oxide semiconductor film 106 has a wider band gap than a silicon film by approximately 1 eV to 2 eV. For that reason, in the transistor including the oxide semiconductor film 106, impact ionization is unlikely to occur and avalanche breakdown is unlikely to occur. That is, it can be said that, in the transistor including the oxide semiconductor film 106, hot-carrier degradation is unlikely to occur.

The oxide semiconductor film to be the oxide semiconductor film 106 generates fewer carriers; therefore, a channel region can be completely depleted by an electric field of the gate electrode 104 even in the case where the thickness of the oxide semiconductor film to be the semiconductor film 106 is large (e.g., greater than or equal to 15 nm and less than 100 nm). Thus, in the transistor including the oxide semiconductor film 106, an increase in an off-state current and a change in a threshold voltage due to a punch-through phenomenon are not caused. When the channel length is, for example, 3 μm, the off-state current can be lower than $10^{-21}$ A or lower than $10^{-24}$ A per micrometer of channel width at room temperature.

The oxygen vacancies in the oxide semiconductor film, which are a factor of generating carriers, can be evaluated by ESR. That is, an oxide semiconductor film with few oxygen vacancies can be referred to as an oxide semiconductor film which does not have a signal due to oxygen vacancies evaluated by ESR. Specifically, the spin density attributed to oxygen vacancies of the oxide semiconductor film is lower than $5 \times 10^{16}$ spins/cm$^3$. When the oxide semiconductor film has oxygen vacancies, a signal having symmetry is found at a g value of around 1.93 in ESR.

The oxide semiconductor film to be the oxide semiconductor film 106 may be formed by a sputtering method, a CVD method, an MBE method, an ALD method, or a PLD method, for example. The semiconductor film to be the oxide semiconductor film 106 is preferably formed by a sputtering method. This is because an oxide semiconductor film having crystallinity and a high density is likely to be formed by a sputtering method. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Here, first heat treatment may be performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, or 1% or more, or 10% or more in order to compensate desorbed oxygen. By the first heat treatment, the crystallinity of the oxide semiconductor film can be improved and further impurities such as hydrogen and water can be removed from the oxide semiconductor film. Further, oxygen is released from the stacked-layer film 102 by the first heat treatment. The oxygen reaches to the oxide semiconductor film 106, whereby oxygen vacancies in the oxide semiconductor film 106 can be reduced.

Figure 9A:
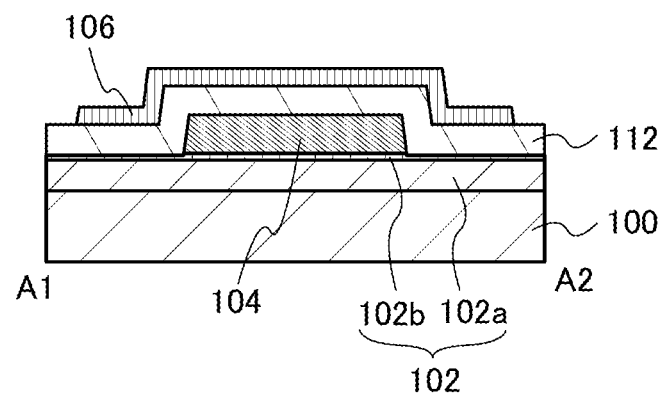
FIGS. 9A to 9C are cross-sectional views illustrating an example of a method for manufacturing the transistor illustrated in FIGS. 2A to 2C.

Next, the oxide semiconductor film to be the oxide semiconductor film 106 is processed to form an island-shaped oxide semiconductor film 106 (see FIG. 9A).

Note that, after the oxide semiconductor film 106 is formed, second heat treatment may be performed. The second heat treatment may be performed under the conditions shown in the first heat treatment. Since the second heat treatment is performed with side surfaces of the oxide semiconductor exposed, impurities such as hydrogen and water are easily removed from the side surfaces of the oxide semiconductor film; thus, impurities can be effectively removed. Note that in the case where the oxide semiconductor film is a CAAC-OS film, impurities are easily diffused along a layer of crystals; thus, impurities such as hydrogen and water are more easily removed from the side surfaces of the oxide semiconductor film.

Then, a conductive film to be the source electrode 116a and the drain electrode 116b is deposited. The conductive film to be the source electrode 116a and the drain electrode 116b may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances. The conductive film to be the source electrode 116a and the drain electrode 116b may be formed by a sputtering method, a CVD method, an MBE method, an ALD method, or a PLD method.

The conductive film to be the source electrode 116a and the drain electrode 116b is processed so that the source electrode 116a and the drain electrode 116b are formed.

Through the above steps, the transistor illustrated in FIGS. 2A to 2C can be manufactured.

Figure 9B:
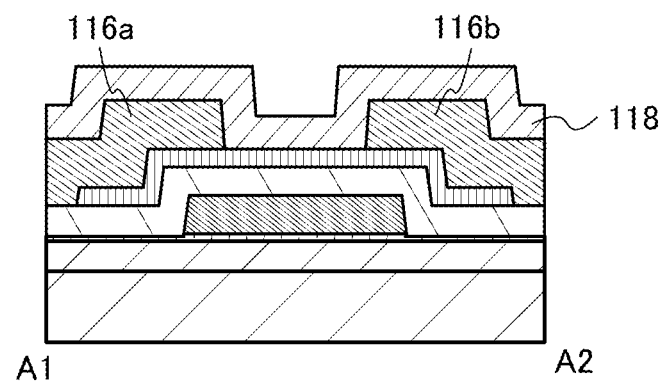

Preferably, the protective insulating film 118 is formed (see FIG. 9B). The protective insulating film 118 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide. The protective insulating film 118 can be formed by a sputtering method, a CVD method, an MBE method, an ALD method, or a PLD method.

As the protective insulating film 118, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the protective insulating film 118 can be an insulating film containing excess oxygen and releasing oxygen by heat treatment.

Next, third heat treatment may be performed. The third heat treatment may be performed under conditions selected from conditions similar to those of the first heat treatment. Oxygen is released from the stacked-layer film 102 and/or the protective insulating film 118 by the third heat treatment. The oxygen reaches to the oxide semiconductor film 106, whereby oxygen vacancies in the oxide semiconductor film 106 can be reduced.

In the transistor illustrated in FIGS. 2A to 2C, oxygen is released from the stacked-layer film 102 and/or the protective insulating film 118, whereby oxygen vacancies in the oxide semiconductor film 106 can be reduced. Therefore, the transistor illustrated in FIGS. 2A to 2C has stable electrical characteristics. Moreover, there are few impurities which serve as carrier generation sources; thus, the transistor can realize an extremely small off-state current. Further, shape defects are not easily generated by providing the stacked-layer film 102; thus, transistors can be manufactured with high yield.

Figure 9C:
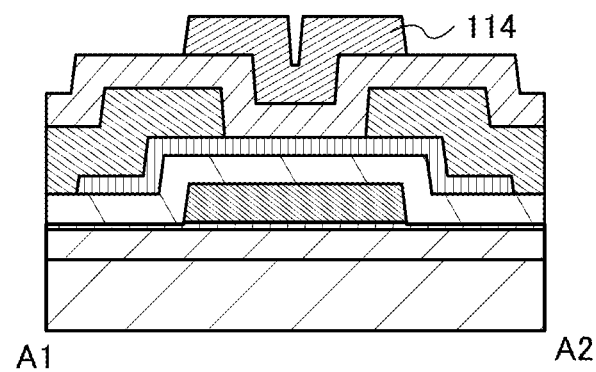

Note that as illustrated in FIG. 9C, a gate electrode 114 may be formed over the protective insulating film 118. The gate electrode 114 may be formed as described below.

First, a conductive film to be the gate electrode 114 is formed. The conductive film to be the gate electrode 114 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; and an alloy containing one or more kinds of the above substances. The conductive film to be the gate electrode 114 may be formed by a sputtering method, a CVD method, an MBE method, an ALD method, or a PLD method.

Then, the conductive film to be the gate electrode 114 is processed so that the gate electrode 114 is formed.

By providing the gate electrode 114, variation in electrical characteristics of the transistor can be reduced. Note that the gate electrode 114 may be connected to the source electrode 116a or the gate electrode 104.

Next, a transistor having a structure different from those of the transistors illustrated in FIGS. 2A to 2C will be described with reference to FIGS. 3A to 3C.

Figure 3A:
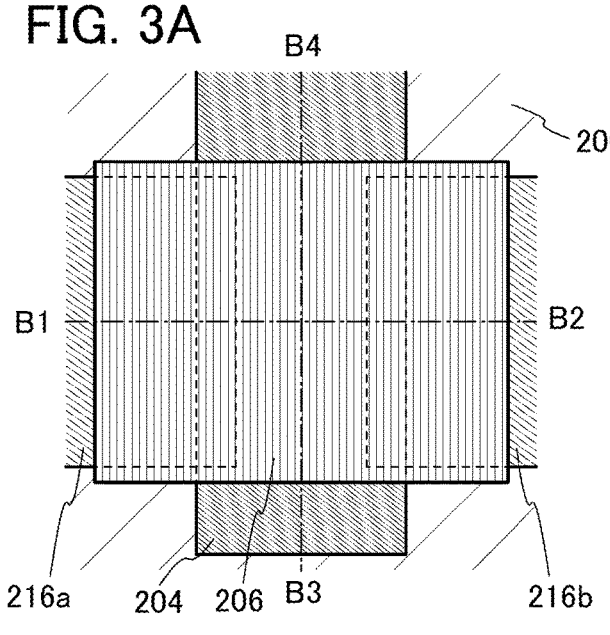
FIGS. 3A to 3C are a top view and cross-sectional views illustrating an example of a transistor according to one embodiment of the present invention.

FIG. 3A is a top view of a transistor according to one embodiment of the present invention. FIG. 3B is a cross-sectional view along dashed-dotted line B1-B2 of FIG. 3A. FIG. 3C is a cross-sectional view taken along dashed-dotted line B3-B4 in FIG. 3A. Note that a gate insulating film 212 and the like are not illustrated in FIG. 3A for easy understanding.

Figure 3C:
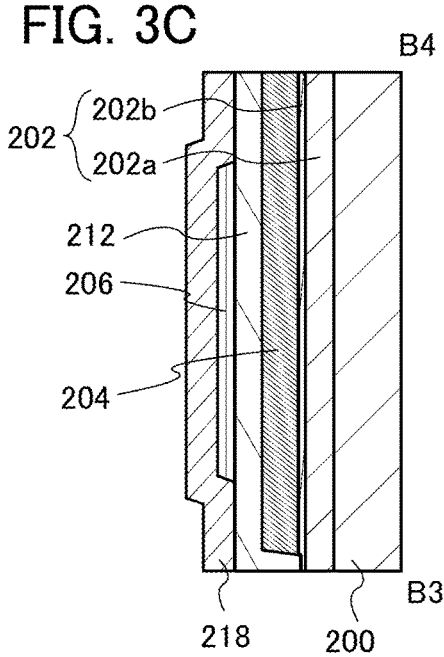
Figure 3B:
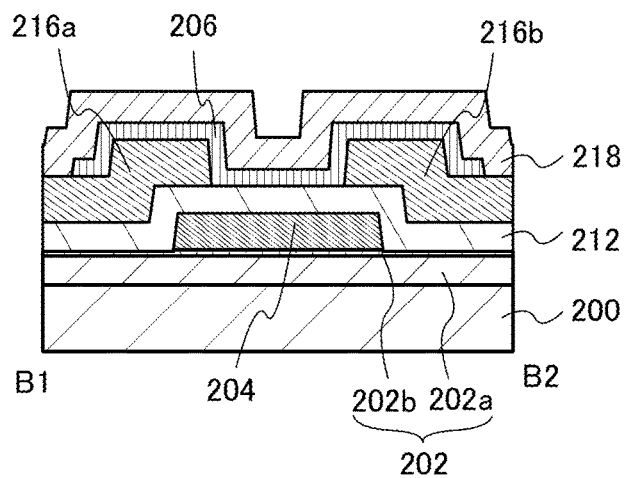

FIG. 3B is a cross-sectional view of a transistor including a stacked-layer film 202 including an oxide insulating film 202a provided over a substrate 200 and a metal oxide film 202b provided over the oxide insulating film 202a, a gate electrode 204 provided over the stacked-layer film 202, a gate insulating film 212 provided over the gate electrode 204, a source electrode 216a and a drain electrode 216b provided over the gate insulating film 212, and an oxide semiconductor film 206 provided over the gate insulating film 212, the source electrode 216a, and the drain electrode 216b and overlapping with the gate electrode 204. Note that a protective insulating film 218 may be provided over the oxide semiconductor film 206, the source electrode 216a, and the drain electrode 216b.

Note that the stacked-layer film 202 (the oxide insulating film 202a and the metal oxide film 202b provided over the oxide insulating film 202a), the gate electrode 204, and the gate insulating film 212 of the transistor illustrated in FIGS. 3A to 3C may be deposited or formed using an insulating film and a method similar to those for the stacked-layer film 102 (the oxide insulating film 102a and the metal oxide film 102b provided over the oxide insulating film 102a), the gate electrode 104, and the gate insulating film 112 of the transistor illustrated in FIGS. 2A to 2C, respectively. Further, the oxide semiconductor film 206, the source electrode 216a, the drain electrode 216b, and the protective insulating film 218 of the transistor illustrated in FIGS. 3A to 3C are different from the oxide semiconductor film 106, the source electrode 116a, the drain electrode 116b, and the protective insulating film 118 of the transistor illustrated in FIGS. 2A to 2C only in the shape, respectively. That is, the transistor in FIGS. 3A to 3C is different from the transistor in FIGS. 2A to 2C only in a positional relationship between the oxide semiconductor film and the source and drain electrodes. Therefore, the description of the transistor in FIGS. 3A to 3C can be referred to for that of the transistor in FIGS. 2A to 2C.

A method for manufacturing the transistor in FIGS. 3A to 3C is described with reference to FIGS. 10A to 10D and FIGS. 11A to 11C. Note that only cross-sectional views corresponding to FIG. 3B are shown for easy understanding in FIGS. 10A to 10D and FIGS. 11A to 11C.

First, the substrate 200 is prepared. As the substrate 200, a substrate similar to the substrate 100 may be used.

Figure 10A:
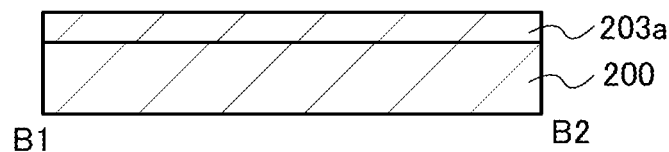
FIGS. 10A to 10D are cross-sectional views illustrating an example of a method for manufacturing the transistor illustrated in FIGS. 3A to 3C.

Next, the oxide insulating film 203a is formed over the substrate 200 (see FIG. 10A).

The oxide insulating film 203a may be formed using an insulating film and a method similar to those for the oxide insulating film 53a.

Next, the metal film 203b is formed. The metal film 203b may be formed with a thickness of 3 nm or more and 15 nm or less, preferably 5 nm or more and 10 nm or less.

The metal film 203b may be formed using a metal film and a method similar to those for the metal film 53b.

Figure 10B:
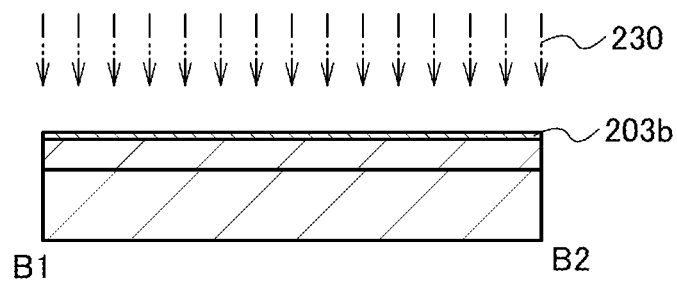

Next, in an atmosphere containing oxygen, plasma is generated and the substrate 200 is exposed to ions 230 having an oxidation property in plasma (see FIG. 10B). The ions 230 may be generated by a method similar to the ions 80.

The metal film 203b is oxidized by being exposed to the ions 230, so that a metal oxide film 202b is formed. Further, oxygen is added to the oxide insulating film 203a, so that an oxide insulating film containing excess oxygen 202a is formed. In this manner, a stacked-layer film 202 including the oxide insulating film 202a and the metal oxide film 202b is formed.

By operation of the ions 230, the metal oxide film 202b can have a surface flatter than that of the metal film 203b. This is because, when the ions 230 collide with the surface of the metal film 203b, the metal film 203b is oxidized and the surface is sputtered. The narrower an incidence angle of the ions 230 is, the higher the sputtering rate of the sputtering by the ions 230 is. In the case where the ions 230 are incident in a direction perpendicular to the substrate 200, the incident angles of the ions 230 to projections are narrow; therefore, the projections are selectively etched. Therefore, proportion of a surface on which the incident angle of the ions 230 is narrow are decreased and proportion of a surface on which the incident angle of the ions 230 is wide (perpendicular to the surface) are increased. That is, a metal oxide film 202b having a flat surface can be obtained.

Specifically, the stacked-layer film 202 can have Ra of 1 nm or less, 0.3 nm or less, or 0.1 nm or less.

As described above, the stacked-layer film 202 is formed using a stacked-layer film and a method similar to those for the stacked-layer film 52. Thus, the stacked-layer film 202 has a function similar to that of the stacked-layer film 52.

Next, a conductive film to be the gate electrode 204 is formed.

Figure 10C:
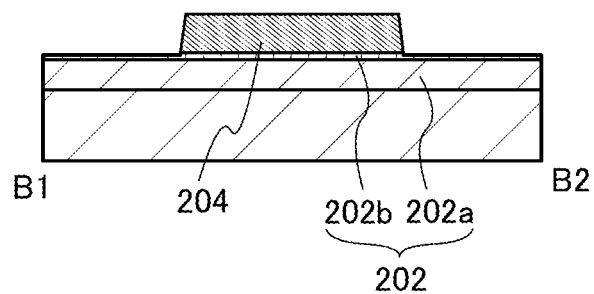

Next, the conductive film to be the gate electrode 204 is processed to form the gate electrode 204 (see FIG. 10C). At this time, the metal oxide film 202b is also etched; however, etching rate of the metal oxide film 202b is slow; thus, the metal oxide film 202b is only slightly etched. Therefore, shape defects are not easily generated by providing the stacked-layer film 202. That is, transistors can be manufactured with high yield. Note that unintended etching can occur in other steps; however, description of the etching is omitted for easy understanding.

Figure 10D:
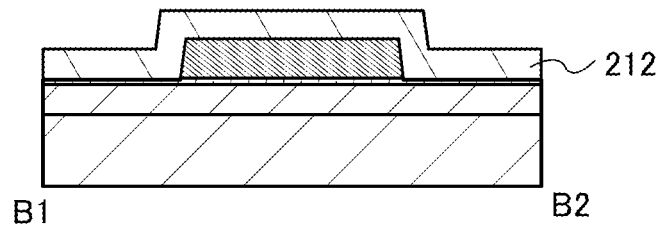

Next, the gate insulating film 212 is formed (see FIG. 10D).

Next, a conductive film to be the source electrode 216a and the drain electrode 216b is formed.

Figure 11A:
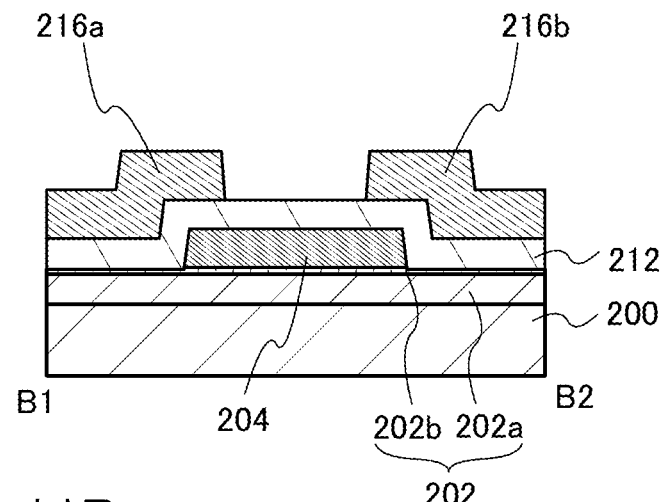
FIGS. 11A to 11C are cross-sectional views illustrating an example of a method for manufacturing the transistor illustrated in FIGS. 3A to 3C.

The conductive film to be the source electrode 216a and the drain electrode 216b is processed to form the source electrode 216a and the drain electrode 216b (see FIG. 11A).

Then, an oxide semiconductor film to be the oxide semiconductor film 206 is formed.

Here, fourth heat treatment may be performed. The fourth heat treatment may be performed under conditions selected from conditions similar to those of the first heat treatment. By the fourth heat treatment, the crystallinity of the oxide semiconductor film can be improved and further impurities such as hydrogen and water can be removed from the oxide semiconductor film. Further, oxygen is released from the stacked-layer film 202 by the fourth heat treatment. The oxygen reaches to the oxide semiconductor film 206, whereby oxygen vacancies in the oxide semiconductor film 206 can be reduced.

Next, the oxide semiconductor film to be the oxide semiconductor film 206 is processed to form an island-shaped oxide semiconductor film 206.

Note that, after the oxide semiconductor film 206 is formed, fifth heat treatment may be performed. The fifth heat treatment may be performed under the conditions shown in the first heat treatment. Since the fifth heat treatment is performed with side surfaces of the oxide semiconductor exposed, impurities such as hydrogen and water are easily removed from the side surfaces of the oxide semiconductor film; thus, impurities can be effectively removed. Note that in the case where the oxide semiconductor film is a CAAC-OS film, impurities are easily diffused along a layer of crystals; thus, impurities such as hydrogen and water are more easily removed from the side surfaces of the oxide semiconductor film.

Through the above steps, the transistor illustrated in FIGS. 3A to 3C can be manufactured.

Figure 11B:
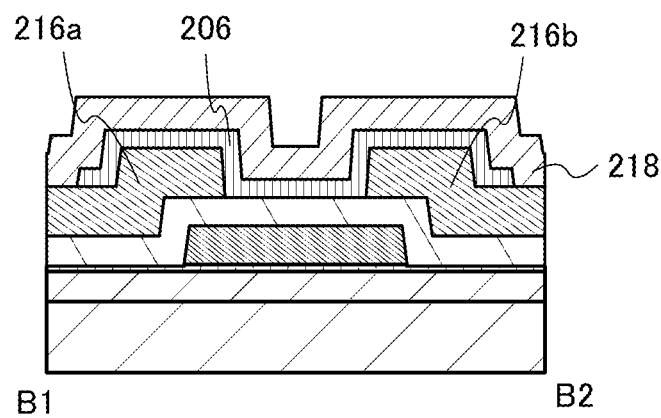

Preferably, the protective insulating film 218 is formed (see FIG. 11B).

Next, sixth heat treatment may be performed. The sixth heat treatment may be performed under conditions selected from conditions similar to those of the first heat treatment. Oxygen is released from the stacked-layer film 202 and/or the protective insulating film 218 by the sixth heat treatment. The oxygen reaches to the oxide semiconductor film 206, whereby oxygen vacancies in the oxide semiconductor film 206 can be reduced.

In the transistor illustrated in FIGS. 3A to 3C, oxygen is released from the stacked-layer film 202 and/or the protective insulating film 218, whereby oxygen vacancies in the oxide semiconductor film 206 can be reduced. Therefore, the transistor illustrated in FIGS. 3A to 3C has stable electrical characteristics. Moreover, there are few impurities which serve as carrier generation sources; thus, the transistor can realize an extremely small off-state current. Further, shape defects are not easily generated by providing the stacked-layer film 202; thus, transistors can be manufactured with high yield.

Figure 11C:
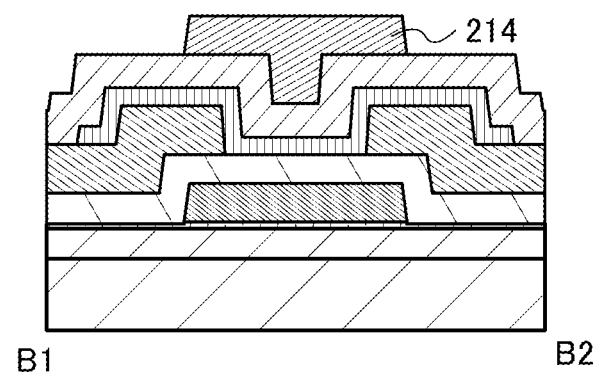

Note that as illustrated in FIG. 11C, a gate electrode 214 may be formed over the protective insulating film 218. The gate electrode 214 may be formed as described below.

First, a conductive film to be the gate electrode 214 is formed. The conductive film to be the gate electrode 214 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; and an alloy containing one or more kinds of the above substances. The conductive film to be the gate electrode 214 may be formed by a sputtering method, a CVD method, an MBE method, an ALD method, or a PLD method.

Then, the conductive film to be the gate electrode 214 is processed so that the gate electrode 214 is formed.

By providing the gate electrode 214, variation in electrical characteristics of the transistor can be reduced. Note that the gate electrode 214 may be connected to the source electrode 216a or the gate electrode 204.

Next, a transistor having a structure different from those of the transistors illustrated in FIGS. 2A to 2C and FIGS. 3A to 3C will be described with reference to FIGS. 4A to 4C.

FIG. 4A is a top view of a transistor according to one embodiment of the present invention. FIG. 4B is a cross-sectional view along dashed-dotted line C1-C2 of FIG. 4A. FIG. 4C is a cross-sectional view taken along dashed-dotted line C3-C4 in FIG. 4A. Note that a gate insulating film 312 and the like are not illustrated in FIG. 4A for easy understanding.

FIG. 4B is a cross-sectional view of a transistor including a stacked-layer film 302 including an oxide insulating film 302a provided over a substrate 300 and a metal oxide film 302b provided over the oxide insulating film 302a, an oxide semiconductor film 306 provided over the stacked-layer film 302, a source electrode 316a and a drain electrode 316b provided over the oxide semiconductor film 306, a gate insulating film 312 provided over the oxide semiconductor film 306, the source electrode 316a, and the drain electrode 316b, and a gate electrode 304 provided over the gate insulating film 312 and overlapping with the oxide semiconductor film 306.

Note that the stacked-layer film 302 (the oxide insulating film 302a and the metal oxide film 302b provided over the oxide insulating film 302a) of the transistor illustrated in FIGS. 4A to 4C may be deposited or formed using a stacked-layer film and a method similar to those for the stacked-layer film 102 (the oxide insulating film 102a and the metal oxide film 102b provided over the oxide insulating film 102a) of the transistor illustrated in FIGS. 2A to 2C. Further, the oxide semiconductor film 306, the source electrode 316a, the drain electrode 316b, the gate insulating film 312, and the gate electrode 304 of the transistor illustrated in FIGS. 4A to 4C are different from the oxide semiconductor film 106, the source electrode 116a, the drain electrode 116b, the gate insulating film 112, and the gate electrode 104 of the transistor illustrated in FIGS. 2A to 2C only in the shape, respectively. That is, the transistor in FIGS. 4A to 4C is different from the transistor in FIGS. 2A to 2C only in a positional relationship between the oxide semiconductor film and the gate electrode. Therefore, the description of the transistor in FIGS. 4A to 4C can be referred to for that of the transistor in FIGS. 2A to 2C.

A method for manufacturing the transistor in FIGS. 4A to 4C is described with reference to FIGS. 12A to 12D. Note that only cross-sectional views corresponding to FIG. 4B are shown for easy understanding in FIGS. 12A to 12D.

First, the substrate 300 is prepared. As the substrate 300, a substrate similar to the substrate 100 may be used.

Figure 12A:
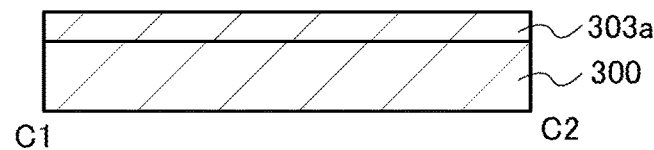
FIGS. 12A to 12D are cross-sectional views illustrating an example of a method for manufacturing the transistor illustrated in FIGS. 4A to 4C.

Next, the oxide insulating film 303a is formed over the substrate 300 (see FIG. 12A).

The oxide insulating film 303a may be formed using an insulating film and a method similar to those for the oxide insulating film 53a.

Next, the metal film 303b is formed. The metal film 303b may be formed with a thickness of 3 nm or more and 15 nm or less, preferably 5 nm or more and 10 nm or less.

The metal film 303b may be formed using a metal film and a method similar to those for the metal film 53b.

Figure 12B:
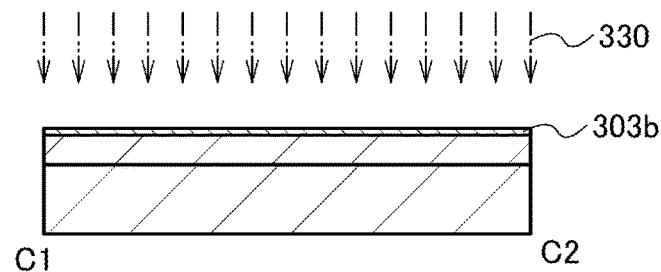

Next, in an atmosphere containing oxygen, plasma is generated and the substrate 300 is exposed to ions 330 having an oxidation property in plasma (see FIG. 12B). The ions 330 may be generated by a method similar to the ions 80.

The metal film 303b is oxidized by being exposed to the ions 330, so that a metal oxide film 302b is formed. Further, oxygen is added to the oxide insulating film 303a, so that an oxide insulating film containing excess oxygen 302a is formed. In this manner, a stacked-layer film 302 including the oxide insulating film 302a and the metal oxide film 302b is formed.

By operation of the ions 330, the metal oxide film 302b can have a surface flatter than that of the metal film 303b. This is because, when the ions 330 collide with the surface of the metal film 303b, the metal film 303b is oxidized and the surface is sputtered. The narrower an incidence angle of the ions 330 is, the higher the sputtering rate of the sputtering by the ions 330 is. In the case where the ions 330 are incident in a direction perpendicular to the substrate 300, the incident angles of the ions 330 to projections are narrow; therefore, the projections are selectively etched. Therefore, proportion of a surface on which the incident angle of the ions 330 is narrow are decreased and proportion of a surface on which the incident angle of the ions 330 is wide (perpendicular to the surface) are increased. That is, a metal oxide film 302b having a flat surface can be obtained.

Specifically, the stacked-layer film 302 can have Ra of 1 nm or less, 0.3 nm or less, or 0.1 nm or less. When the staked-layer film 302 is less than or equal to the above Ra, the oxide semiconductor film 306 having high crystallinity can be provided. Further, when the degree of roughness at the interface between the stacked-layer film 302 and the oxide semiconductor film 306 is small, the influence of interface scattering can be reduced.

As described above, the stacked-layer film 302 is formed using a stacked-layer film and a method similar to those for the stacked-layer film 52. Thus, the stacked-layer film 302 has a function similar to that of the stacked-layer film 52.

Next, an oxide semiconductor film to be the oxide semiconductor film 306 is formed.

Here, seventh heat treatment may be performed. The seventh heat treatment may be performed under conditions selected from conditions similar to those of the first heat treatment. By the seventh heat treatment, the crystallinity of the oxide semiconductor film can be improved and further impurities such as hydrogen and water can be removed from the oxide semiconductor film. Further, oxygen is released from the stacked-layer film 302 by the seventh heat treatment. The oxygen reaches to the oxide semiconductor film 306, whereby oxygen vacancies in the oxide semiconductor film 306 can be reduced.

Figure 12C:
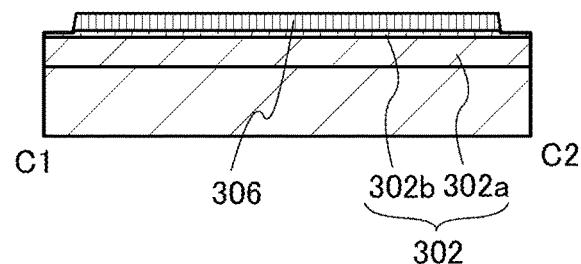

Next, the oxide semiconductor film to be the oxide semiconductor film 306 is processed to form an island-shaped oxide semiconductor film 306 (see FIG. 12C). At this time, the metal oxide film 302b is also etched; however, etching rate of the metal oxide film 302b is slow; thus, the metal oxide film 302b is only slightly etched. Therefore, shape defects are not easily generated by providing the stacked-layer film 302. That is, transistors can be manufactured with high yield. Note that unintended etching can occur in other steps; however, description of the etching is omitted for easy understanding.

Note that, after the oxide semiconductor film 306 is formed, eighth heat treatment may be performed. The eighth heat treatment may be performed under the conditions shown in the first heat treatment. Since the eighth heat treatment is performed with side surfaces of the oxide semiconductor exposed, impurities such as hydrogen and water are easily removed from the side surfaces of the oxide semiconductor film; thus, impurities can be effectively removed. Note that in the case where the oxide semiconductor film is a CAAC-OS film, impurities are easily diffused along a layer of crystals; thus, impurities such as hydrogen and water are more easily removed from the side surfaces of the oxide semiconductor film.

Next, a conductive film to be the source electrode 316a and the drain electrode 316b is formed.

The conductive film to be the source electrode 316a and the drain electrode 316b is processed to form the source electrode 316a and the drain electrode 316b.

Next, the gate insulating film 312 is formed.

Next, a conductive film to be the gate electrode 304 is formed.

Figure 12D:
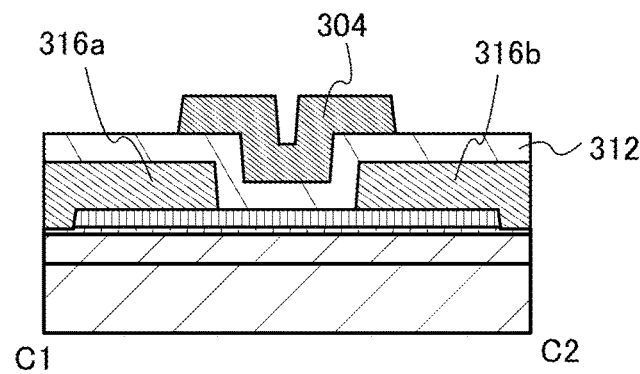

Then, the conductive film to be the gate electrode 304 is processed to form the gate electrode 304 (see FIG. 12D).

Through the above steps, the transistor illustrated in FIGS. 4A to 4C can be manufactured.

In the transistor illustrated in FIGS. 4A to 4C, oxygen is released from the stacked-layer film 302, whereby oxygen vacancies in the oxide semiconductor film 306 can be reduced. Therefore, the transistor illustrated in FIGS. 4A to 4C has stable electrical characteristics. Moreover, there are few impurities which serve as carrier generation sources; thus, the transistor can realize an extremely small off-state current. Further, shape defects are not easily generated by providing the stacked-layer film 302; thus, transistors can be manufactured with high yield.

Next, a transistor having a structure different from those of the transistors illustrated in FIGS. 2A to 2C, FIGS. 3A to 3C, and FIGS. 4A to 4C will be described with reference to FIGS. 5A to 5C.

Figure 5A:
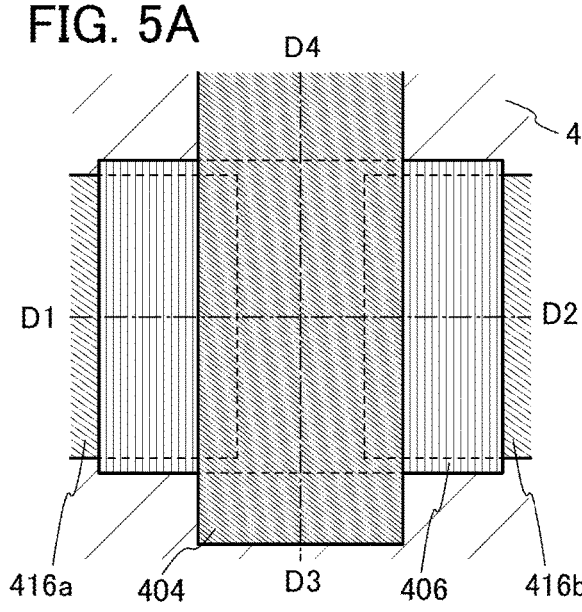
FIGS. 5A to 5C are a top view and cross-sectional views illustrating an example of a transistor according to one embodiment of the present invention.

FIG. 5A is a top view of a transistor according to one embodiment of the present invention. FIG. 5B is a cross-sectional view along dashed-dotted line D1-D2 of FIG. 5A. FIG. 5C is a cross-sectional view taken along dashed-dotted line D3-D4 in FIG. 5A. Note that a gate insulating film 412 and the like are not illustrated in FIG. 5A for easy understanding.

Figure 5C:
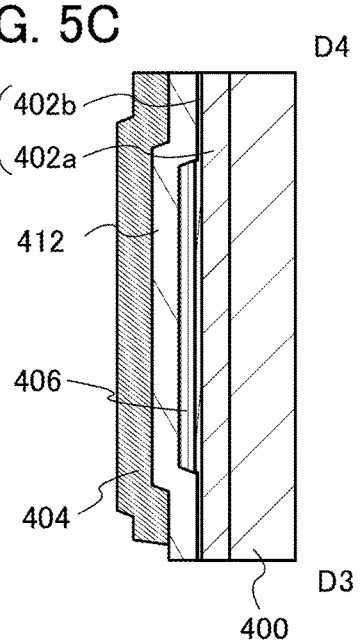
Figure 5B:
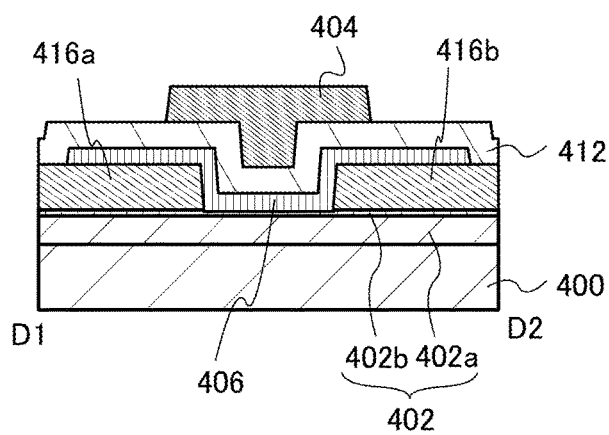

FIG. 5B is a cross-sectional view of a transistor including a stacked-layer film 402 including an oxide insulating film 402a provided over a substrate 400 and a metal oxide film 402b provided over the oxide insulating film 402a, a source electrode 416a and a drain electrode 416b provided over the stacked-layer film 402, an oxide semiconductor film 406 provided over the stacked-layer film 402, the source electrode 416a, and the drain electrode 416b, a gate insulating film 412 provided over the oxide semiconductor film 406, and a gate electrode 404 provided over the gate insulating film 412 and overlapping with the oxide semiconductor film 406.

Note that the stacked-layer film 402 (the oxide insulating film 402a and the metal oxide film 402b provided over the oxide insulating film 402a) of the transistor illustrated in FIGS. 5A to 5C may be deposited or formed using an insulating film and a method similar to those for the stacked-layer film 302 (the oxide insulating film 302a and the metal oxide film 302b provided over the oxide insulating film 302a) of the transistor illustrated in FIGS. 4A to 4C. Further, the oxide semiconductor film 406, the source electrode 416a, the drain electrode 416b, the gate insulating film 412, and the gate electrode 404 of the transistor illustrated in FIGS. 5A to 5C are different from the oxide semiconductor film 306, the source electrode 316a, the drain electrode 316b, the gate insulating film 312, and the gate electrode 304 of the transistor illustrated in FIGS. 4A to 4C only in the shape, respectively. That is, the transistor in FIGS. 5A to 5C is different from the transistor in FIGS. 4A to 4C only in a positional relationship between the oxide semiconductor film and the source and drain electrodes. Therefore, the description of the transistor in FIGS. 5A to 5C can be referred to for that of the transistors in FIGS. 2A to 2C, FIGS. 3A to 3C, and FIGS. 4A to 4C.

A method for manufacturing the transistor in FIGS. 5A to 5C is described with reference to FIGS. 13A to 13D. Note that only cross-sectional views corresponding to FIG. 5B are shown for easy understanding in FIGS. 13A to 13D.

First, the substrate 400 is prepared. As the substrate 400, a substrate similar to the substrate 100 may be used.

Figure 13A:
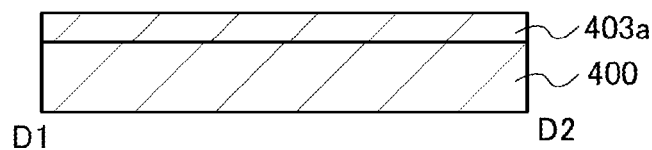
FIGS. 13A to 13D are cross-sectional views illustrating an example of a method for manufacturing the transistor illustrated in FIGS. 5A to 5C.

Next, the oxide insulating film 403a is formed over the substrate 400 (see FIG. 13A).

The oxide insulating film 403a may be formed using an insulating film and a method similar to those for the oxide insulating film 53a.

Next, the metal film 403b is formed. The metal film 403b may be formed with a thickness of 3 nm or more and 15 nm or less, preferably 5 nm or more and 10 nm or less.

The metal film 403b may be formed using a metal film and a method similar to those for the metal film 53b.

Figure 13B:
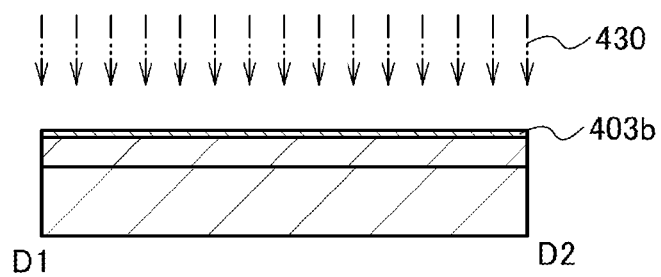

Next, in an atmosphere containing oxygen, plasma is generated and the substrate 400 is exposed to ions 430 having an oxidation property in plasma (see FIG. 13B). The ions 430 may be generated by a method similar to the ions 80.

The metal film 403b is oxidized by being exposed to the ions 430, so that a metal oxide film 402b is formed. Further, oxygen is added to the oxide insulating film 403a, so that an oxide insulating film containing excess oxygen 402a is formed. In this manner, a stacked-layer film 402 including the oxide insulating film 402a and the metal oxide film 402b is formed.

By operation of the ions 430, the metal oxide film 402b can have a surface flatter than that of the metal film 403b. This is because, when the ions 430 collide with the surface of the metal film 403b, the metal film 403b is oxidized and the surface is sputtered. The narrower an incidence angle of the ions 430 is, the higher the sputtering rate of the sputtering by the ions 430 is. In the case where the ions 430 are incident in a direction perpendicular to the substrate 400, the incident angles of the ions 430 to projections are narrow; therefore, the projections are selectively etched. Therefore, proportion of a surface on which the incident angle of the ions 430 is narrow are decreased and proportion of a surface on which the incident angle of the ions 430 is wide (perpendicular to the surface) are increased. That is, a metal oxide film 402b having a flat surface can be obtained.

Specifically, the stacked-layer film 402 can have Ra of 1 nm or less, 0.3 nm or less, or 0.1 nm or less. When the staked-layer film 402 is less than or equal to the above Ra, the oxide semiconductor film 406 having high crystallinity can be provided. Further, when the degree of roughness at the interface between the stacked-layer film 402 and the oxide semiconductor film 406 is small, the influence of interface scattering can be reduced.

As described above, the stacked-layer film 402 is formed using a stacked-layer film and a method similar to those for the stacked-layer film 52. Thus, the stacked-layer film 402 has a function similar to that of the stacked-layer film 52.

Next, a conductive film to be the source electrode 416a and the drain electrode 416b is formed.

Figure 13C:
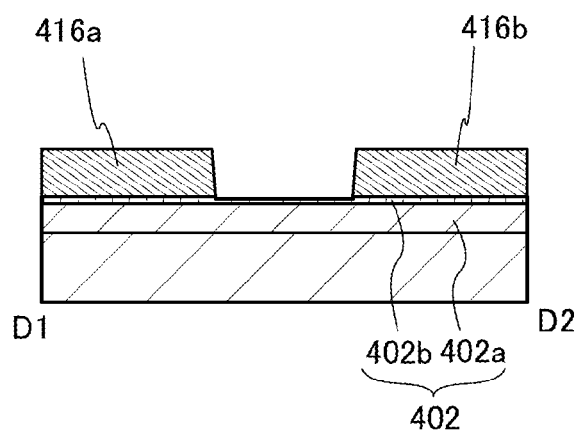

Next, the conductive film to be the source electrode 416a and the drain electrode 416b is processed to form the source electrode 416a and the drain electrode 416b (see FIG. 13C). At this time, the metal oxide film 402b is also etched; however, etching rate of the metal oxide film 402b is slow; thus, the metal oxide film 402b is only slightly etched. Therefore, shape defects are not easily generated by providing the stacked-layer film 402. That is, transistors can be manufactured with high yield. Note that unintended etching can occur in other steps; however, description of the etching is omitted for easy understanding.

Next, an oxide semiconductor film to be the oxide semiconductor film 406 is formed.

Here, ninth heat treatment may be performed. The ninth heat treatment may be performed under conditions selected from conditions similar to those of the first heat treatment. By the ninth heat treatment, the crystallinity of the oxide semiconductor film can be improved and further impurities such as hydrogen and water can be removed from the oxide semiconductor film. Further, oxygen is released from the stacked-layer film 402 by the ninth heat treatment. The oxygen reaches to the oxide semiconductor film 406, whereby oxygen vacancies in the oxide semiconductor film 406 can be reduced.

Next, the oxide semiconductor film to be the oxide semiconductor film 406 is processed to form an island-shaped oxide semiconductor film 406.

Note that, after the oxide semiconductor film 406 is formed, tenth heat treatment may be performed. The tenth heat treatment may be performed under the conditions shown in the first heat treatment. Since the tenth heat treatment is performed with side surfaces of the oxide semiconductor exposed, impurities such as hydrogen and water are easily removed from the side surfaces of the oxide semiconductor film; thus, impurities can be effectively removed. Note that in the case where the oxide semiconductor film is a CAAC-OS film, impurities are easily diffused along a layer of crystals; thus, impurities such as hydrogen and water are more easily removed from the side surfaces of the oxide semiconductor film.

Next, the gate insulating film 412 is formed.

Next, a conductive film to be the gate electrode 404 is formed.

Figure 13D:
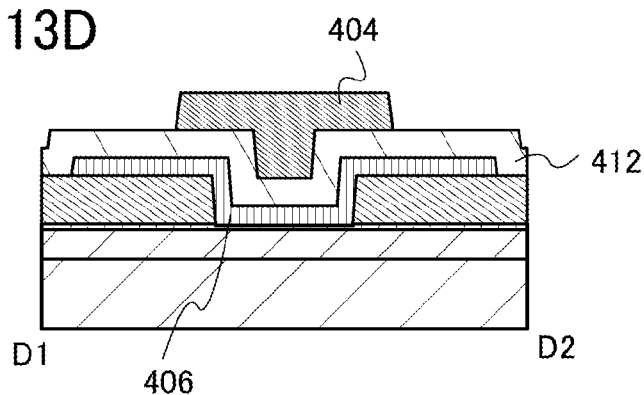

Then, the conductive film to be the gate electrode 404 is processed to form the gate electrode 404 (see FIG. 13D).

Through the above steps, the transistor illustrated in FIGS. 5A to 5C can be manufactured.

In the transistor illustrated in FIGS. 5A to 5C, oxygen is released from the stacked-layer film 402, whereby oxygen vacancies in the oxide semiconductor film 406 can be reduced. Therefore, the transistor illustrated in FIGS. 5A to 5C has stable electrical characteristics. Moreover, there are few impurities which serve as carrier generation sources; thus, the transistor can realize an extremely small off-state current. Further, shape defects are not easily generated by providing the stacked-layer film 402; thus, transistors can be manufactured with high yield.

Next, a transistor having a structure different from those of the transistors illustrated in FIGS. 2A to 2C, FIGS. 3A to 3C, FIGS. 4A to 4C, and FIGS. 5A to 5C will be described with reference to FIGS. 6A to 6C.

Figure 6A:
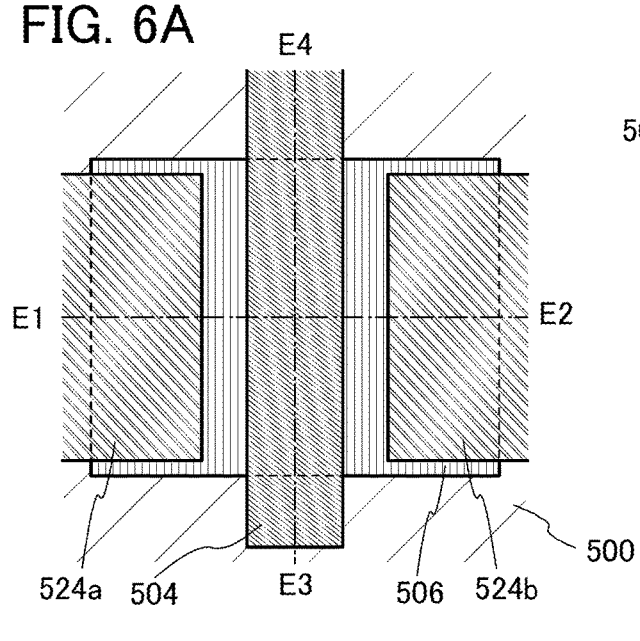
FIGS. 6A to 6C are a top view and cross-sectional views illustrating an example of a transistor according to one embodiment of the present invention.

FIG. 6A is a top view of a transistor according to one embodiment of the present invention. FIG. 6B is a cross-sectional view along dashed-dotted line E1-E2 of FIG. 6A. FIG. 6C is a cross-sectional view taken along dashed-dotted line E3-E4 in FIG. 6A. Note that a gate insulating film 512 and the like are not illustrated in FIG. 6A for easy understanding.

Figure 6C:
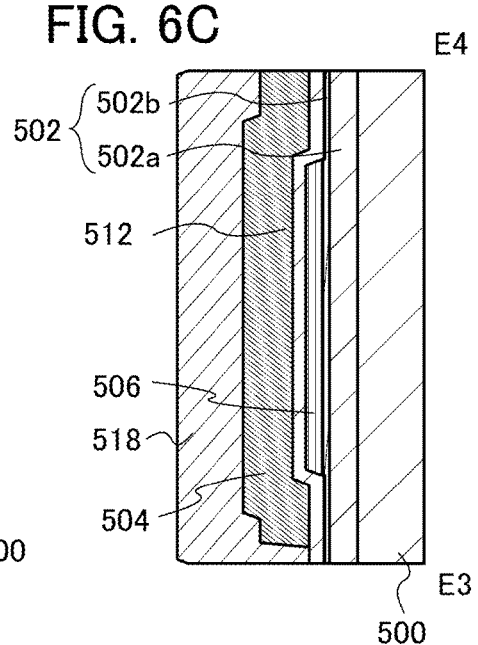
Figure 6B:
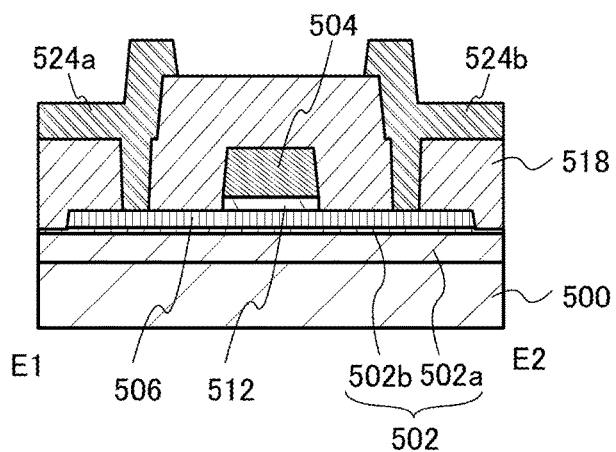

FIG. 6B is a cross-sectional view of a transistor including a stacked-layer film 502 including an oxide insulating film 502a provided over a substrate 500 and a metal oxide film 502b provided over the oxide insulating film 502a, an oxide semiconductor film 506 provided over the stacked-layer film 502, a gate insulating film 512 provided over the oxide semiconductor film 506, and a gate electrode 504 provided over the gate insulating film 512 and overlapping with the oxide semiconductor film 506.

In the cross-sectional view in FIG. 6B, a protective insulating film 518 is provided over the oxide semiconductor film 506 and the gate electrode 504. Note that openings reaching the oxide semiconductor film 506 are formed in the protective insulating film 518, and a wiring 524a and a wiring 524b provided over the protective insulating film 518 are in contact with the oxide semiconductor film 506 through the openings.

Note that although the gate insulating film 512 is provided only in a region overlapping with the gate electrode 504 in FIG. 6B, one embodiment of the present invention is not limited to this structure. For example, the gate insulating film 512 may be provided so as to cover the oxide semiconductor film 506. Alternatively, a sidewall insulating film may be provided in contact with a side surface of the gate electrode 504.

In the case of providing the sidewall insulating film, it is preferred that, in the oxide semiconductor film 506, a region overlapping with the sidewall insulating film has lower resistance than a region overlapping with the gate electrode 504. For example, in the oxide semiconductor film 506, a region not overlapping with the gate electrode 504 may contain an impurity that reduces the resistance of the oxide semiconductor film 506. Alternatively, the resistance of the region may be reduced by defects. In the oxide semiconductor film 506, the region overlapping with the sidewall insulating film has lower resistance than the region overlapping with the gate electrode 504; thus, the region serves as a lightly doped drain (LDD) region. With the LDD regions of the transistor, drain induced barrier lowering (DIBL) and hot-carrier degradation can be suppressed. Note that in the oxide semiconductor film 506, the region overlapping with the sidewall insulating film may serve also as an offset region. Also with the offset region of the transistor, DIBL and hot-carrier degradation can be suppressed.

It is preferred that, in the oxide semiconductor film 506, the region not overlapping with the gate electrode 504 has lower resistance than a region overlapping with the gate electrode 504. For example, in the oxide semiconductor film 506, the region not overlapping with the gate electrode 504 may contain an impurity that reduces the resistance of the oxide semiconductor film 506. Alternatively, the resistance of the region may be reduced by defects. In the oxide semiconductor film 506, the region not overlapping with the gate electrode 504 has lower resistance than the region overlapping with the gate electrode 504; thus, the region can serve as a source region and a drain region of the transistor.

In the transistor illustrated in FIGS. 6A to 6C, a region where the gate electrode 504 overlaps with another wiring and electrode is small; therefore, parasitic capacitance is unlikely to be generated. Accordingly, the switching characteristics of the transistor can be enhanced. Moreover, the channel length of the transistor is determined by the width of the gate electrode 504; therefore, a miniaturized transistor having a short channel length is manufactured easily.

A method for manufacturing the transistor in FIGS. 6A to 6C is described with reference to FIGS. 14A to 14D. Note that only cross-sectional views corresponding to FIG. 6B are shown for easy understanding in FIGS. 14A to 14D.

First, the substrate 500 is prepared. As the substrate 500, a substrate similar to the substrate 100 may be used.

Figure 14A:
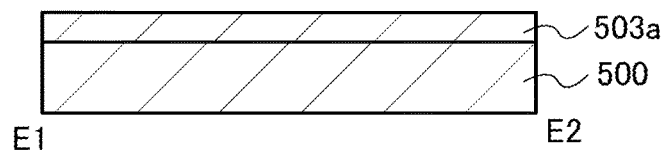
FIGS. 14A to 14D are cross-sectional views illustrating an example of a method for manufacturing the transistor illustrated in FIGS. 6A to 6C.

Next, the oxide insulating film 503a is formed over the substrate 500 (see FIG. 14A).

The oxide insulating film 503a may be formed using an insulating film and a method similar to those for the oxide insulating film 53a.

Next, the metal film 503b is formed. The metal film 503b may be formed with a thickness of 3 nm or more and 15 nm or less, preferably 5 nm or more and 10 nm or less.

The metal film 503b may be formed using a metal film and a method similar to those for the metal film 53b.

Figure 14B:
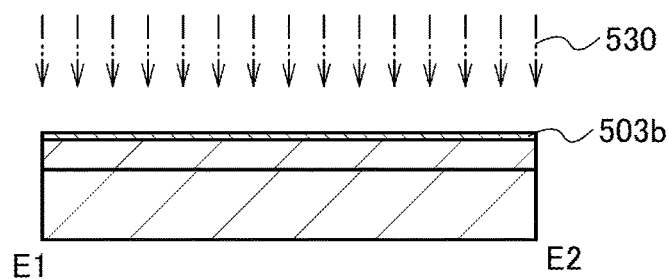

Next, in an atmosphere containing oxygen, plasma is generated and the substrate 500 is exposed to ions 530 having an oxidation property in plasma (see FIG. 14B). The ions 530 may be generated by a method similar to the ions 80.

The metal film 503b is oxidized by being exposed to the ions 530, so that a metal oxide film 502b is formed. Further, oxygen is added to the oxide insulating film 503a, so that an oxide insulating film containing excess oxygen 502a is formed. In this manner, a stacked-layer film 502 including the oxide insulating film 502a and the metal oxide film 502b is formed.

By operation of the ions 530, the metal oxide film 502b can have a surface flatter than that of the metal film 503b. This is because, when the ions 530 collide with the surface of the metal film 503b, the metal film 503b is oxidized and the surface is sputtered. The narrower an incidence angle of the ions 530 is, the higher the sputtering rate of the sputtering by the ions 530 is. In the case where the ions 530 are incident in a direction perpendicular to the substrate 500, the incident angles of the ions 530 to projections are narrow; therefore, the projections are selectively etched. Therefore, proportion of a surface on which the incident angle of the ions 530 is narrow are decreased and proportion of a surface on which the incident angle of the ions 530 is wide (perpendicular to the surface) are increased. That is, a metal oxide film 502b having a flat surface can be obtained.

Specifically, the stacked-layer film 502 can have Ra of 1 nm or less, 0.3 nm or less, or 0.1 nm or less. When the staked-layer film 502 is less than or equal to the above Ra, the oxide semiconductor film 506 having high crystallinity can be provided. Further, when the degree of roughness at the interface between the stacked-layer film 502 and the oxide semiconductor film 506 is small, the influence of interface scattering can be reduced.

As described above, the stacked-layer film 502 is formed using a stacked-layer film and a method similar to those for the stacked-layer film 52. Thus, the stacked-layer film 502 has a function similar to that of the stacked-layer film 52.

Next, an oxide semiconductor film to be the oxide semiconductor film 506 is formed. The oxide semiconductor film to be the oxide semiconductor film 506 may be formed using an oxide semiconductor film and a method similar to those for the oxide semiconductor film 106.

Note that, after the oxide semiconductor film is formed, eleventh heat treatment may be performed. The eleventh heat treatment may be performed under the conditions shown in the first heat treatment. By the eleventh heat treatment, the crystallinity of the oxide semiconductor film can be improved and further impurities such as hydrogen and water can be removed from the oxide semiconductor film. Further, oxygen is released from the stacked-layer film 502 by the eleventh heat treatment. The oxygen reaches to the oxide semiconductor film 506, whereby oxygen vacancies in the oxide semiconductor film 506 can be reduced.

Figure 14C:
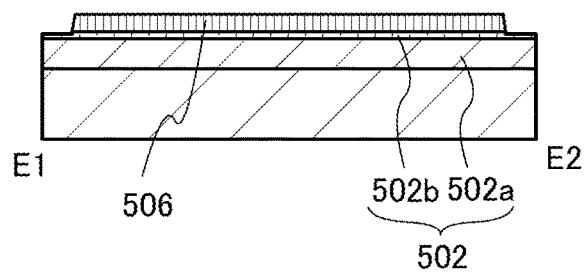

Next, the oxide semiconductor film to be the oxide semiconductor film 506 is processed to form an island-shaped oxide semiconductor film 506 (see FIG. 14C). At this time, the metal oxide film 502b is also etched; however, etching rate of the metal oxide film 502b is slow; thus, the metal oxide film 502b is only slightly etched. Therefore, shape defects are not easily generated by providing the stacked-layer film 502. That is, transistors can be manufactured with high yield. Note that unintended etching can occur in other steps; however, description of the etching is omitted for easy understanding.

Note that, after the oxide semiconductor film 506 is formed, twelfth heat treatment may be performed. The twelfth heat treatment may be performed under the conditions shown in the first heat treatment. Since the twelfth heat treatment is performed with side surfaces of the oxide semiconductor exposed, impurities such as hydrogen and water are easily removed from the side surfaces of the oxide semiconductor film; thus, impurities can be effectively removed. Note that in the case where the oxide semiconductor film is a CAAC-OS film, impurities are easily diffused along a layer of crystals; thus, impurities such as hydrogen and water are more easily removed from the side surfaces of the oxide semiconductor film.

Next, an insulating film to be the gate insulating film 512 is formed. The insulating film to be the gate insulating film 512 may be formed using an insulating film and a method similar to those for the gate insulating film 112.

Next, a conductive film to be the gate electrode 504 is formed. The conductive film to be the gate electrode 504 may be formed using a conductive film and a method similar to those for the gate electrode 104.

Next, the conductive film to be the gate electrode 504 is processed to form the gate electrode 504.

Figure 14D:
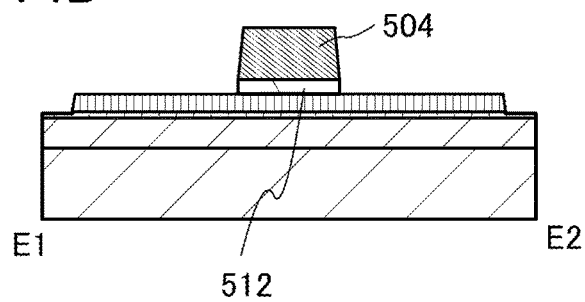

Next, the insulating film to be the gate insulating film 512 is processed to form the gate insulating film 512 using a resist mask used for processing the gate electrode 504 or the gate electrode 504 as a mask (see FIG. 14D).

Next, an impurity may be added to the oxide semiconductor film 506 using the gate electrode 504 as a mask. As the impurity, an impurity selected from the impurities that reduce the resistance of the oxide semiconductor film 506 may be added. As the impurity, one or more of helium, boron, nitrogen, fluorine, neon, aluminum, phosphorus, argon, arsenic, krypton, indium, tin, antimony, and xenon may be added. The impurity may be added by an ion implantation method or an ion doping method, preferably, an ion implantation method. At this time, the acceleration voltage is made higher than or equal to 5 kV and lower than or equal to 100 kV. The amount of the added impurity is made greater than or equal to $1 \times 10^{14}$ ions/cm$^2$ and less than or equal to $1 \times 10^{16}$ ions/cm$^2$.

Next, thirteenth heat treatment may be performed. The thirteenth heat treatment may be performed under conditions selected from conditions similar to those of the first heat treatment. By the thirteenth heat treatment, a region of the oxide semiconductor film 506, to which an impurity is added, can be made a low-resistant region.

Through the above steps, the transistor illustrated in FIGS. 6A to 6C can be manufactured.

Next, the protective insulating film 518 is formed. The protective insulating film 518 may be formed using an insulating film and a method similar to those for the protective insulating film 118.

Next, the protective insulating film 518 is processed to form openings exposing the oxide semiconductor film 506.

Next, a conductive film to be the wiring 524a and the wiring 524b is formed. The conductive film to be the wiring 524a and the wiring 524b may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; and an alloy containing one or more kinds of the above substances. The conductive film to be the wiring 524a and the wiring 524b may be formed by a sputtering method, a CVD method, an MBE method, an ALD method, or a PLD method.

The conductive film to be the wiring 524a and the wiring 524b is processed to form the wiring 524a and the wiring 524b.

In the transistor illustrated in FIGS. 6A to 6C, oxygen is released from the stacked-layer film 502, whereby oxygen vacancies in the oxide semiconductor film 506 can be reduced. Therefore, the transistor illustrated in FIGS. 6A to 6C has stable electrical characteristics. Moreover, there are few impurities which serve as carrier generation sources; thus, the transistor can realize an extremely small off-state current. Further, shape defects are not easily generated by providing the stacked-layer film 502; thus, transistors can be manufactured with high yield.

Next, a transistor having a structure different from those of the transistors illustrated in FIGS. 2A to 2C, FIGS. 3A to 3C, FIGS. 4A to 4C, FIGS. 5A to 5C, and FIGS. 6A to 6C will be described with reference to FIGS. 7A to 7C.

Figure 7A:
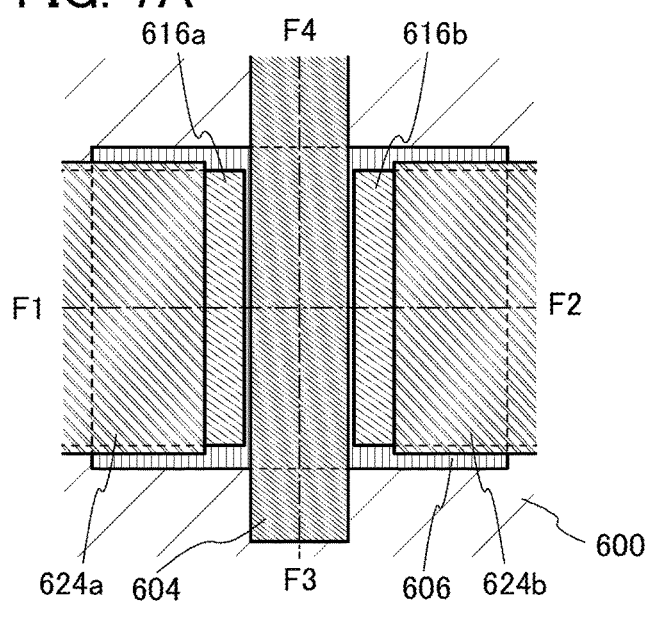
FIGS. 7A to 7C are a top view and cross-sectional views illustrating an example of a transistor according to one embodiment of the present invention.

FIG. 7A is a top view of a transistor according to one embodiment of the present invention. FIG. 7B is a cross-sectional view along dashed-dotted line F1-F2 of FIG. 7A. FIG. 7C is a cross-sectional view taken along dashed-dotted line F3-F4 in FIG. 7A. Note that a gate insulating film 612 and the like are not illustrated in FIG. 7A for easy understanding.

Figure 7C:
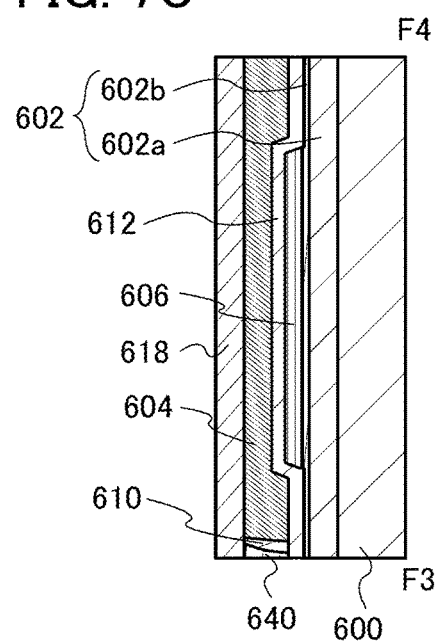
Figure 7B:
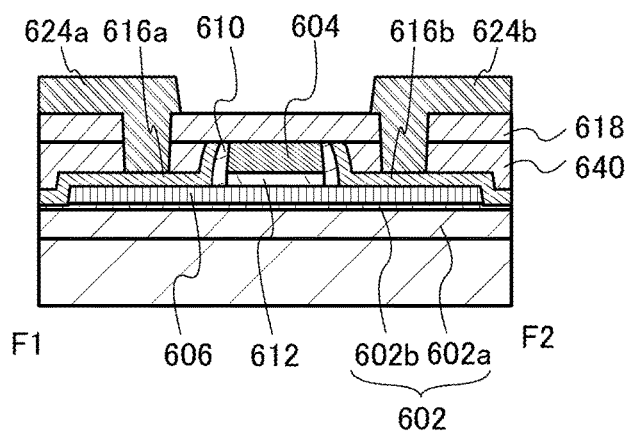

FIG. 7B is a cross-sectional view of a transistor including a stacked-layer film 602 including an oxide insulating film 602a provided over a substrate 600 and a metal oxide film 602b provided over the oxide insulating film 602a, an oxide semiconductor film 606 provided over the stacked-layer film 602, a gate insulating film 612 provided over the oxide semiconductor film 606, a gate electrode 604 provided over the gate insulating film 612, sidewall insulating films 610 provided in contact with side surfaces of the gate electrode 604, a source electrode 616a and a drain electrode 616b provided over the oxide semiconductor film 606 and the sidewall insulating films 610, and an insulating film 640 provided over the source electrode 616a and the drain electrode 616b.

In the cross-sectional view illustrated in FIG. 7B, a protective insulating film 618 is provided over the gate electrode 604, the source electrode 616a, and the drain electrode 616b. Note that openings reaching the source electrode 616a and the drain electrode 616b are formed in the insulating film 640 and the protective insulating film 618, and a wiring 624a and a wiring 624b provided over the protective insulating film 618 are in contact with the source electrode 616a and the drain electrode 616b through the openings.

Note that although the sidewall insulating film 610 is provided on the side surfaces of the gate insulating film 612 in FIG. 7B, one embodiment of the present invention is not limited to this structure. For example, the sidewall insulating film 610 may be provided over the gate insulating film 612.

Note that, in FIG. 7B, the surfaces of the gate electrode 604, the sidewall insulating film 610, the source electrode 616a and the drain electrode 616b, and the insulating film 640 are level with one another.

It is preferred that, in the oxide semiconductor film 606, a region not overlapping with the gate electrode 604 has lower resistance than a region overlapping with the gate electrode 604. For example, in the oxide semiconductor film 606, the region not overlapping with the gate electrode 604 may contain an impurity that reduces the resistance of the oxide semiconductor film 606. Alternatively, the resistance of the region may be reduced by defects. In the oxide semiconductor film 606, the region not overlapping with the gate electrode 604 has lower resistance than the region overlapping with the gate electrode 604; thus, the region can serve as a source region and a drain region of the transistor. However, since the transistor illustrated in FIG. 7B includes the source electrode 616a and the drain electrode 616b, a source region and a drain region are not necessarily provided.

It is preferred that, in the oxide semiconductor film 606, a region overlapping with the sidewall insulating film 610 has higher resistance than a region overlapping with the source electrode 616a and the drain electrode 616b and lower resistance than a region overlapping with the gate electrode 604. For example, in the oxide semiconductor film 606, the region not overlapping with the gate electrode 604 may contain an impurity that reduces the resistance of the oxide semiconductor film 606. Alternatively, the resistance of the region may be reduced by defects. In the oxide semiconductor film 606, the region overlapping with the sidewall insulating film 610 has higher resistance than the source electrode 616a and the drain electrode 616b and lower resistance than the region overlapping with the gate electrode 604; thus, the region serves as an LDD region. With the LDD regions of the transistor, DIBL and hot-carrier degradation can be suppressed. Note that in the oxide semiconductor film 606, the region overlapping with the sidewall insulating film 610 may serve also as an offset region. Also with the offset region of the transistor, DIBL and hot-carrier degradation can be suppressed.

In the transistor illustrated in FIGS. 7A to 7C, a region where the gate electrode 604 overlaps with another wiring and electrode is small; therefore, parasitic capacitance is unlikely to be generated. Accordingly, the switching characteristics of the transistor can be enhanced. The source electrode 616a and the drain electrode 616b are provided, whereby parasitic resistance can be made lower than that of the transistor illustrated in FIGS. 6A to 6C. Accordingly, an on-state current can be increased. Moreover, the channel length of the transistor is determined by the width of the gate electrode 604; therefore, a miniaturized transistor having a short channel length is manufactured easily.

A method for manufacturing the transistor in FIGS. 7A to 7C is described with reference to FIGS. 15A to 15D and FIGS. 16A to 16C. Note that only cross-sectional views corresponding to FIG. 7B are shown for easy understanding in FIGS. 15A to 15D and FIGS. 16A to 16C.

First, the substrate 600 is prepared. As the substrate 600, a substrate similar to the substrate 100 may be used.

Figure 15A:
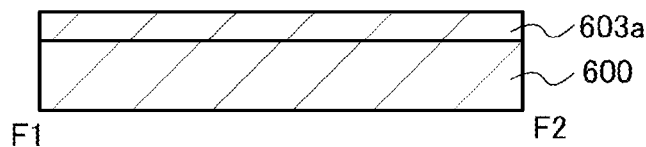
FIGS. 15A to 15D are cross-sectional views illustrating an example of a method for manufacturing the transistor illustrated in FIGS. 7A to 7C.

Next, the oxide insulating film 603a is formed over the substrate 600 (see FIG. 15A).

The oxide insulating film 603a may be formed using an insulating film and a method similar to those for the oxide insulating film 53a.

Next, the metal film 603b is formed. The metal film 603b may be formed with a thickness of 3 nm or more and 15 nm or less, preferably 5 nm or more and 10 nm or less.

The metal film 603b may be formed using a metal film and a method similar to those for the metal film 53b.

Figure 15B:
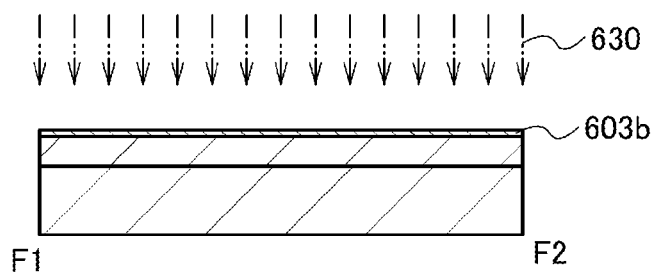

Next, in an atmosphere containing oxygen, plasma is generated and the substrate 600 is exposed to ions 630 having an oxidation property in plasma (see FIG. 15B). The ions 630 may be generated by a method similar to the ions 80.

The metal film 603b is oxidized by being exposed to the ions 630, so that a metal oxide film 602b is formed. Further, oxygen is added to the oxide insulating film 603a, so that an oxide insulating film containing excess oxygen 602a is formed. In this manner, a stacked-layer film 602 including the oxide insulating film 602a and the metal oxide film 602b is formed.

By operation of the ions 630, the metal oxide film 602b can have a surface flatter than that of the metal film 603b. This is because, when the ions 630 collide with the surface of the metal film 603b, the metal film 603b is oxidized and the surface is sputtered. The narrower an incidence angle of the ions 630 is, the higher the sputtering rate of the sputtering by the ions 630 is. In the case where the ions 630 are incident in a direction perpendicular to the substrate 600, the incident angles of the ions 630 to projections are narrow; therefore, the projections are selectively etched. Therefore, proportion of a surface on which the incident angle of the ions 630 is narrow are decreased and proportion of a surface on which the incident angle of the ions 630 is wide (perpendicular to the surface) are increased. That is, a metal oxide film 602b having a flat surface can be obtained.

Specifically, the stacked-layer film 602 can have Ra of 1 nm or less, 0.3 nm or less, or 0.1 nm or less. When the staked-layer film 602 is less than or equal to the above Ra, the oxide semiconductor film 606 having high crystallinity can be provided. Further, when the degree of roughness at the interface between the stacked-layer film 602 and the oxide semiconductor film 606 is small, the influence of interface scattering can be reduced.

As described above, the stacked-layer film 602 is formed using a stacked-layer film and a method similar to those for the stacked-layer film 52. Thus, the stacked-layer film 602 has a function similar to that of the stacked-layer film 52.

Next, an oxide semiconductor film to be the oxide semiconductor film 606 is formed. The oxide semiconductor film to be the oxide semiconductor film 606 may be formed using an oxide semiconductor film and a method similar to those for the oxide semiconductor film 106.

Note that, after the oxide semiconductor film is formed, fourteenth heat treatment may be performed. The fourteenth heat treatment may be performed under the conditions shown in the first heat treatment. By the fourteenth heat treatment, the crystallinity of the oxide semiconductor film can be improved and further impurities such as hydrogen and water can be removed from the oxide semiconductor film. Further, oxygen is released from the stacked-layer film 602 by the fourteenth heat treatment. The oxygen reaches to the oxide semiconductor film 606, whereby oxygen vacancies in the oxide semiconductor film 606 can be reduced.

Figure 15C:
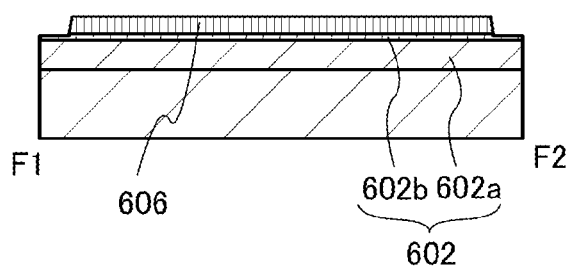

Next, the oxide semiconductor film to be the oxide semiconductor film 606 is processed to form an island-shaped oxide semiconductor film 606 (see FIG. 15C). At this time, the metal oxide film 602b is also etched; however, etching rate of the metal oxide film 602b is slow; thus, the metal oxide film 602b is only slightly etched. Therefore, shape defects are not easily generated by providing the stacked-layer film 602. That is, transistors can be manufactured with high yield. Note that unintended etching can occur in other steps; however, description of the etching is omitted for easy understanding.

Note that, after the oxide semiconductor film 606 is formed, fifteenth heat treatment may be performed. The fifteenth heat treatment may be performed under the conditions shown in the first heat treatment. Since the fifteenth heat treatment is performed with side surfaces of the oxide semiconductor exposed, impurities such as hydrogen and water are easily removed from the side surfaces of the oxide semiconductor film; thus, impurities can be effectively removed. Note that in the case where the oxide semiconductor film is a CAAC-OS film, impurities are easily diffused along a layer of crystals; thus, impurities such as hydrogen and water are more easily removed from the side surfaces of the oxide semiconductor film.

Next, an insulating film to be the gate insulating film 612 is formed. The insulating film to be the gate insulating film 612 may be formed using an insulating film and a method similar to those for the gate insulating film 112.

Next, a conductive film to be the gate electrode 604 is formed. The conductive film to be the gate electrode 604 may be formed using a conductive film and a method similar to those for the gate electrode 104.

Next, the conductive film to be the gate electrode 604 is processed to form a conductive film 605 to be the gate electrode 604.

Figure 15D:
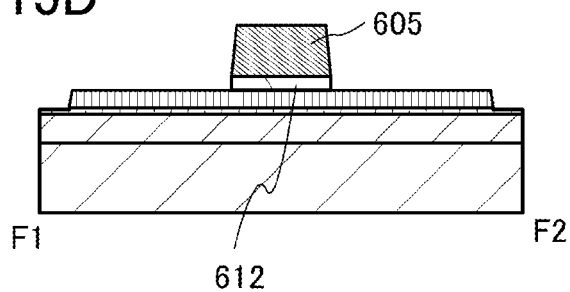

Next, the insulating film to be the gate insulating film 612 is processed to form the gate insulating film 612 using a resist mask used for processing the conductive film 605 to be the gate electrode 604 or the conductive film 605 to be the gate electrode 604 as a mask (see FIG. 15D).

Next, an impurity may be added to the oxide semiconductor film 606 using the conductive film 605 to be the gate electrode 604 as a mask (this step is also referred to as a first impurity addition step). As the impurity, an impurity selected from the impurities that reduce the resistance of the oxide semiconductor film 606 may be added. As the impurity, one or more of helium, boron, nitrogen, fluorine, neon, aluminum, phosphorus, argon, arsenic, krypton, indium, tin, antimony, and xenon may be added. The impurity may be added by an ion implantation method or an ion doping method, preferably, an ion implantation method. At this time, the acceleration voltage is made higher than or equal to 5 kV and lower than or equal to 100 kV. The amount of the added impurity is made greater than or equal to $1\times10^{14}$ ions/cm$^2$ and less than or equal to $1\times10^{16}$ ions/cm$^2$.

Next, sixteenth heat treatment may be performed. The sixteenth heat treatment may be performed under conditions selected from conditions similar to those of the first heat treatment. By the sixteenth heat treatment, a region of the oxide semiconductor film 606, to which an impurity is added, can be made a low-resistant region.

Next, an insulating film to be the sidewall insulating film 611 is formed. The insulating film to be the sidewall insulating film 611 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide. The insulating film to be the sidewall insulating films 611 may be formed by a sputtering method, a CVD method, an MBE method, an ALD method, or a PLD method.

Figure 16A:
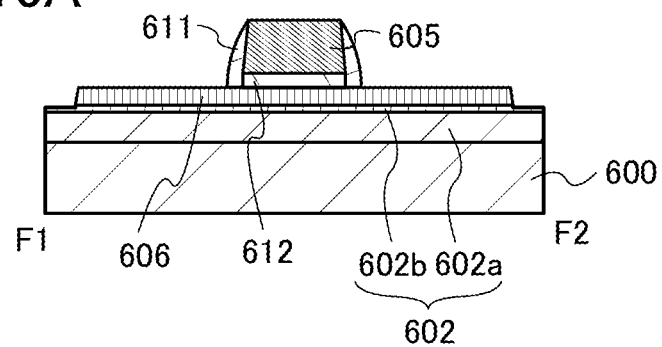
FIGS. 16A to 16C are cross-sectional views illustrating an example of a method for manufacturing the transistor illustrated in FIGS. 7A to 7C.

Next, highly anisotropic etching treatment is performed on the insulating film to be the sidewall insulating film 611, whereby the sidewall insulating film 611 which is in contact with side surfaces of the gate insulating film 612 and the conductive film 605 to be the gate electrode 604 can be formed (see FIG. 16A).

Next, an impurity may be added to the oxide semiconductor film 606 using the conductive film 605 to be the gate electrode 604 and the sidewall insulating film 611 as masks (this step is also referred to as a second impurity addition step). The conditions of the first impurity addition step can be referred to for the second impurity addition step. Two kinds of low-resistance regions can be provided in the oxide semiconductor film 606 by performing the first impurity addition step and the second impurity addition step. Therefore, electric-field concentration at an edge of the drain electrode is likely to be relieved and hot-carrier degradation can be effectively suppressed. Moreover, the edge of the source electrode has less influence of the electric field from the edge of the drain electrode; therefore, DIBL can be suppressed. Note that either one of the first impurity addition step and the second impurity addition step may be performed.

Next, seventeenth heat treatment may be performed. The seventeenth heat treatment may be performed under conditions selected from conditions similar to those of the first heat treatment. By the seventeenth heat treatment, a region of the oxide semiconductor film 606, to which an impurity is added, can be made a low-resistant region.

Next, a conductive film to be the source electrode 616a and the drain electrode 616b is formed. The conductive film to be the source electrode 616a and the drain electrode 616b may be formed using a conductive film and a method similar to those for the source electrode 116a and the drain electrode 116b.

Next, the conductive film to be the source electrode 616a and the drain electrode 616b is processed to form a conductive film 616.

Figure 16B:
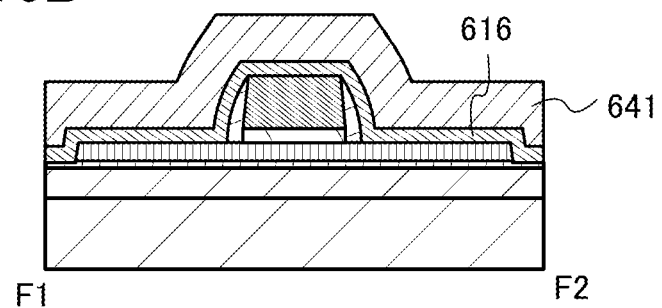
Figure 16C:
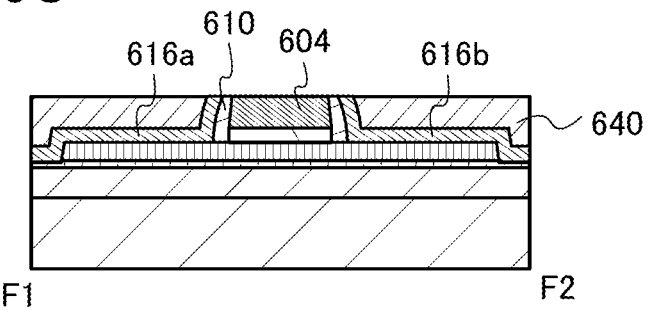

Next, an insulating film 641 to be the insulating film 640 is formed (see FIG. 16B). The insulating film 641 to be the insulating film 640 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide. The insulating film 641 to be the insulating film 640 may be formed by a sputtering method, a CVD method, an MBE method, an ALD method, or a PLD method.

Next, the insulating film 641, the conductive film 616, the sidewall insulating film 611, and the conductive film 605 are processed so that the surfaces of these films are level with one another. The processing can be performed by dry etching treatment or chemical mechanical polishing (CMP) treatment. By the processing, the conductive film 605 becomes the gate electrode 604, the sidewall insulating film 611 becomes the sidewall insulating film 610, the conductive film 616 becomes the source electrode 616a and the drain electrode 616b, and the insulating film 641 becomes the insulating film 640 (see FIG. 16C).

The source electrode 616a and the drain electrode 616b are formed in this manner, whereby the distance between the gate electrode 604 and the source electrode 616a or the drain electrode 616b can be made similar to the thickness of the sidewall insulating film 610. Thus, the length of the distance between the gate electrode 604 and the source electrode 616a or the drain electrode 616b can be made smaller than the minimum feature size; therefore, the structure is suitable in manufacturing a miniaturized transistor.

Here, the stacked-layer film 602 with a slow etching rate is provided, whereby a substrate or a film to be a base film is not easily affected by etching. For example, when the above-described films are processed so that the surfaces of these films are level with one another, a substrate or a film to be a base film is etched, whereby steps of heights before these films are processed may be generated. Shape defects may be generated; for example, layers which should be separated after the processing are partly connected, depending on the steps of the heights before these films are processed. The etching rate of the stacked-layer film 602 is slow; therefore, steps of heights by etching the stacked-layer film 602 before these films are processed are not generated. That is, generation of the shape defects of the transistor can be reduced.

Through the above steps, the transistor illustrated in FIGS. 7A to 7C can be manufactured.

Next, the protective insulating film 618 is formed. The protective insulating film 618 may be formed using an insulating film and a method similar to those for the protective insulating film 118.

Next, openings exposing the source electrode 616a and the drain electrode 616b are formed by processing the insulating film 640 and the protective insulating film 618.

Next, a conductive film to be the wiring 624a and the wiring 624b is formed. The conductive film to be the wiring 624a and the wiring 624b may be formed using a conductive film and a method similar to those for the wiring 524a and the wiring 524b.

Then, the conductive film to be the wiring 624a and the wiring 624b is processed to form the wiring 624a and the wiring 624b.

In the transistor illustrated in FIGS. 7A to 7C, oxygen is released from the stacked-layer film 602, whereby oxygen vacancies in the oxide semiconductor film 606 can be reduced. Therefore, the transistor illustrated in FIGS. 7A to 7C has stable electrical characteristics. Moreover, there are few impurities which serve as carrier generation sources; thus, the transistor can realize an extremely small off-state current. Further, shape defects are not easily generated by providing the stacked-layer film 602; thus, transistors can be manufactured with high yield.

According to this embodiment, transistors having stable electrical characteristics can be manufactured with high yield.

This embodiment shows an example of a basic principle. Thus, part or the whole of this embodiment can be freely combined with, applied to, or replaced with part or the whole of another embodiment.

Embodiment 3

In this embodiment, a semiconductor device including a memory element to which any of the transistors described in the above embodiments is applied will be described.

In the transistor described in the above embodiment, not only stable electrical characteristics are given, but also the off-state current of the transistor can be significantly reduced. That is, the transistor has electrical characteristics in which leakage of charge through the transistor is unlikely to occur.

A semiconductor device which includes a transistor having such electric characteristics will be described below. The semiconductor device includes a memory element which is superior in function to a known memory element.

Figure 17A:
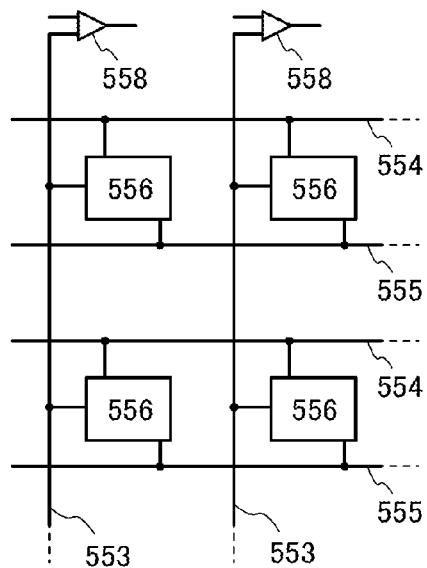
FIGS. 17A to 17D are circuit diagrams and a cross-sectional view illustrating a semiconductor device according to one embodiment of the present invention, and a graph showing electrical characteristics thereof.
Figure 17B:
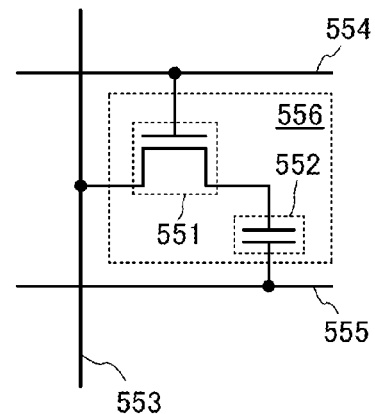
Figure 17C:
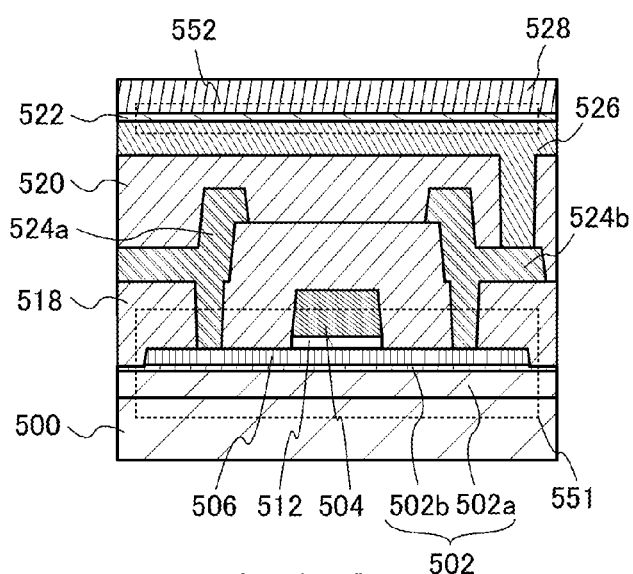
Figure 17D:
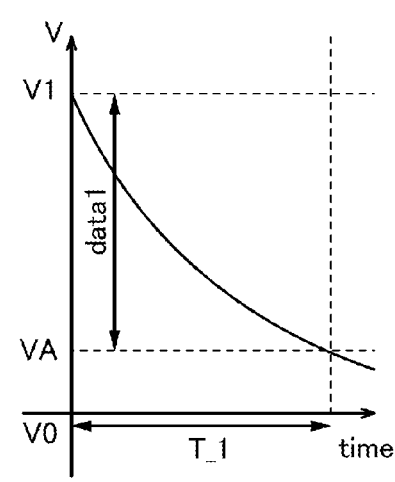

First, the semiconductor device will be specifically described with reference to FIGS. 17A to 17D. FIG. 17A is a circuit diagram showing a memory cell array of the semiconductor device. FIG. 17B is a circuit diagram of a memory cell. FIG. 17C illustrates an example of a cross-sectional structure corresponding to the memory cell in FIG. 17B. FIG. 17D is a graph showing electric characteristics of the memory cell in FIG. 17B.

The memory cell array in FIG. 17A includes a plurality of memory cells 556, a plurality of bit lines 553, a plurality of word lines 554, a plurality of capacitor lines 555, and a plurality of sense amplifiers 558.

Note that the bit lines 553 and the word lines 554 are provided in a grid pattern, and the memory cell 556 is provided for each intersection of the bit line 553 and the word line 554. The bit lines 553 are connected to the respective sense amplifiers 558. The sense amplifiers 558 have a function of reading the potentials of the bit lines 553 as data.

As shown in FIG. 17B, the memory cell 556 includes a transistor 551 and a capacitor 552. A gate of the transistor 551 is electrically connected to the word line 554. A source of the transistor 551 is electrically connected to the bit line 553. A drain of the transistor 551 is electrically connected to one terminal of the capacitor 552. The other terminal of the capacitor 552 is electrically connected to the capacitor line 555.

FIG. 17C illustrates an example of a cross-sectional structure of the memory cell. FIG. 17C is a cross-sectional view of the semiconductor device including the transistor 551, the wirings 524a and 524b connected to the transistor 551, an insulating film 520 over the transistor 551 and the wirings 524a and 524b, and the capacitor 552 over the insulating film 520.

In FIG. 17C, the transistor illustrated in FIGS. 6A to 6C is used as an example of the transistor 551. Therefore, for components of the transistor 551 which are not particularly described below, refer to the description in the above embodiment.

The insulating film 520 can be provided using methods and an insulating film which are similar to those of the protective insulating film 518. Alternatively, a resin film of a polyimide resin, an acrylic resin, an epoxy resin, a silicone resin, or the like may be used as the insulating film 520.

The capacitor 552 includes an electrode 526 in contact with the wiring 524b, an electrode 528 overlapping with the electrode 526, and an insulating film 522 provided between the electrode 526 and the electrode 528.

The electrode 526 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The electrode 528 may be formed of a single layer or a stacked layer of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances.

The insulating film 522 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

In the example of FIG. 17C, the transistor 551 and the capacitor 552 are provided in different layers; however, one embodiment of the present invention is not limited to this structure. For example, the transistor 551 and the capacitor 552 may be provided in the same layer. With such a structure, memory cells having similar structures can be disposed so as to overlap with each other, in which case, a large number of memory cells can be integrated in an area for one memory cell. Accordingly, the degree of integration of the semiconductor device can be improved. Note that in this specification, "A overlaps with B" means that A and B are provided such that at least part of A overlaps with at least part of B.

Here, the wiring 524a in FIG. 17C is electrically connected to the bit line 553 in FIG. 17B. The gate electrode 504 in FIG. 17C is electrically connected to the word line 554 in FIG. 17B. The electrode 528 in FIG. 17C is electrically connected to the capacitor line 555 in FIG. 17B.

As shown in FIG. 17D, a voltage held in the capacitor 552 gradually decreases with time due to leakage through the transistor 551. A voltage originally charged from V0 to V1 is decreased with time to VA that is a limit for reading out data 1. This period is called a holding period T_1. In the case of a two-level memory cell, refresh operation needs to be performed within the holding period T_1.

For example, in the case where the off-state current of the transistor 551 is not sufficiently small, the holding period T_1 becomes short because the voltage held in the capacitor 552 significantly changes with time. Accordingly, refresh operation needs to be frequently performed. An increase in frequency of refresh operation increases power consumption of the semiconductor device.

Since the off-state current of the transistor 551 is extremely small in this embodiment, the holding period T_1 can be made extremely long. Further, the frequency of refresh operation can be reduced; thus, power consumption can be reduced. For example, in the case where a memory cell is formed using the transistor 551 having an off-state current of $1 \times 10^{-21}$ A to $1 \times 10^{-25}$ A, data can be held for several days to several decades without supply of electric power.

As described above, according to one embodiment of the present invention, a semiconductor device with high degree of integration and low power consumption can be provided.

Figure 18A:
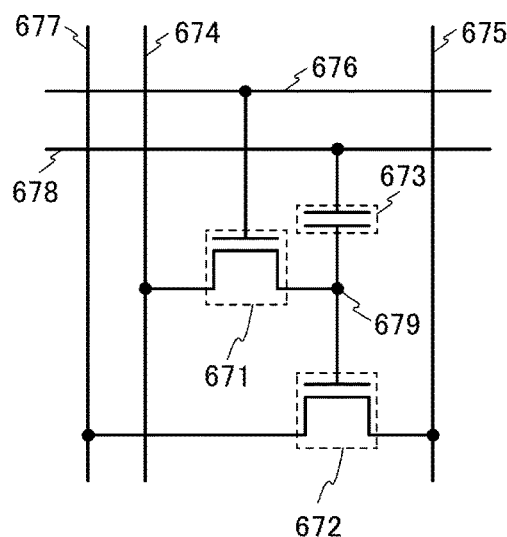
FIGS. 18A to 18C are a circuit diagram, a graph showing electrical characteristics, and a cross-sectional view illustrating a semiconductor device according to one embodiment of the present invention.
Figure 18B:
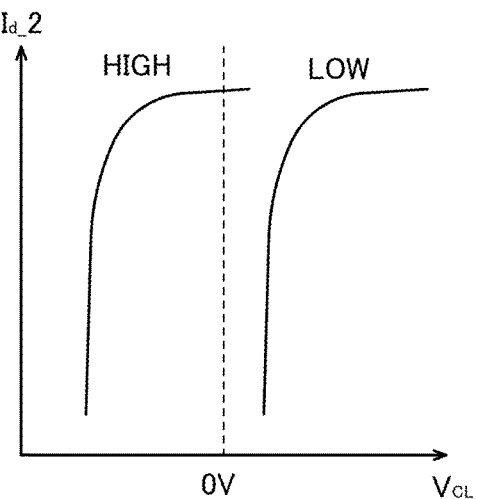
Figure 18C:
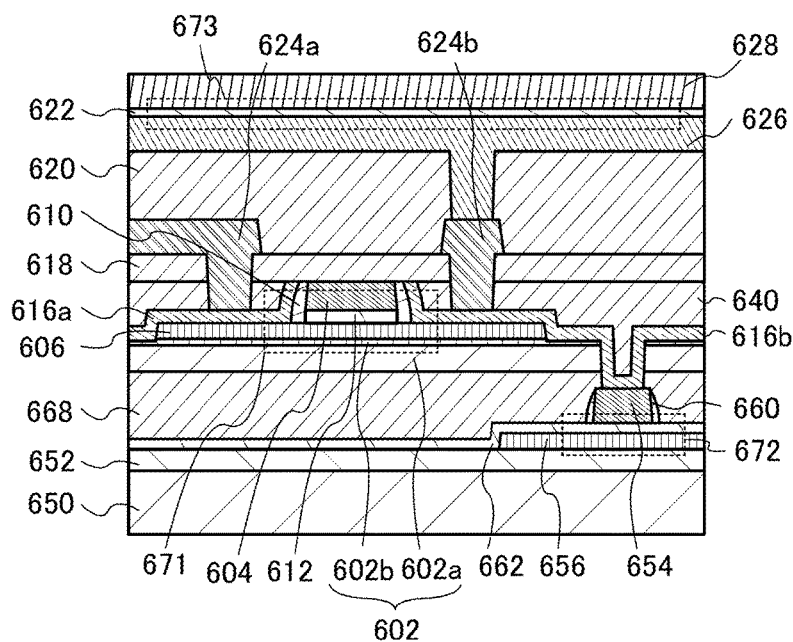

Next, a semiconductor device having a structure different from that in FIGS. 17A to 17D will be described with reference to FIGS. 18A to 18C. FIG. 18A is a circuit diagram showing a memory cell and wirings included in the semiconductor device. FIG. 18B is a graph showing electric characteristics of the memory cell in FIG. 18A. FIG. 18C is an example of a cross-sectional view corresponding to the memory cell in FIG. 18A.

As shown in FIG. 18A, the memory cell includes a transistor 671, a transistor 672, and a capacitor 673. Here, a gate of the transistor 671 is electrically connected to a word line 676. A source of the transistor 671 is electrically connected to a source line 674. A drain of the transistor 671 is electrically connected to a gate of the transistor 672 and one terminal of the capacitor 673. A portion where the drain of the transistor 671 is electrically connected to the gate of the transistor 672 and the one terminal of the capacitor 673 is referred to as a node 679. A source of the transistor 672 is electrically connected to a source line 675. A drain of the transistor 672 is electrically connected to a drain line 677. The other terminal of the capacitor 673 is electrically connected to a capacitor line 678.

The semiconductor device illustrated in FIGS. 18A to 18C utilizes variation in the apparent threshold voltage of the transistor 672, which depends on the potential of the node 679. For example, FIG. 18B shows a relation between a voltage $VC_L$ of the capacitor line 678 and a drain current $I_{d\_}2$ flowing through the transistor 672.

The potential of the node 679 can be controlled through the transistor 671. For example, the potential of the source line 674 is set to a power supply potential VDD. In this case, when the potential of the word line 676 is set to be higher than or equal to a potential obtained by adding the power supply potential VDD to the threshold voltage Vth of the transistor 671, the potential of the node 679 can be HIGH. Further, when the potential of the word line 676 is set to be lower than or equal to the threshold voltage Vth of the transistor 671, the potential of the node 679 can be LOW.

Thus, the transistor 672 has electric characteristics shown with either a $V_{CL}$-$I_{d\_}2$ curve denoted as LOW or a $VC_L$-$I_{d\_}2$ curve denoted as HIGH. That is, when the potential of the node 679 is LOW, $I_{d\_}2$ is small at a $VC_L$ of 0 V; accordingly, data 0 is stored. Further, when the potential of the node 679 is HIGH, $I_{d\_}2$ is large at a $VC_L$ of 0 V; accordingly, data 1 is stored. In such a manner, data can be stored.

FIG. 18C illustrates an example of a cross-sectional structure of the memory cell. FIG. 18C is a cross-sectional view of the semiconductor device including the transistor 672; an insulating film 668 over the transistor 672; the transistor 671 over the insulating film 668; the wirings 624a and 624b connected to the transistor 671; an insulating film 620 over the transistor 671 and the wirings 624a and 624b; and the capacitor 673 over the insulating film 620.

The insulating film 620 may be formed using an insulating film similar to that of the protective insulating film 118. Alternatively, a resin film of a polyimide resin, an acrylic resin, an epoxy resin, a silicone resin, or the like may be used as the insulating film 620.

In FIG. 18C, the transistor illustrated in FIGS. 7A to 7C is used as an example of the transistor 671. Therefore, for components of the transistor 671 which are not particularly described below, refer to the description in the above embodiment.

In this embodiment, the case where a transistor including crystalline silicon is used as the transistor 672 will be described. Note that any of the transistors described in the above embodiment may be used as the transistor 672.

The transistor including crystalline silicon has an advantage that on-state characteristics can be improved more easily than a transistor including an oxide semiconductor film. Therefore, it can be said that the transistor including crystalline silicon is suitable for the transistor 672 for which excellent on-state characteristics are required.

Here, the transistor 672 includes a base insulating film 652 over a substrate 650; a crystalline silicon film 656 over the base insulating film 652; a gate insulating film 662 over the crystalline silicon film 656; a gate electrode 654 overlapping with the crystalline silicon film 656, over the gate insulating film 662; and sidewall insulating films 660 in contact with sidewalls of the gate electrode 654.

The substrate 650 may be formed using a substrate similar to that for the substrate 100.

The base insulating film 652 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide. Alternatively, the base insulating film 652 may be formed using a stacked-layer film and a method similar to those for the stacked-layer film 602.

As the crystalline silicon film 656, a silicon film such as a single crystal silicon film or a polycrystalline silicon film may be used.

Note that the crystalline silicon film is used in the transistor 672 in this embodiment; however, in the case where the substrate 650 is a semiconductor substrate such as a silicon wafer, a channel region and source and drain regions may be provided in the semiconductor substrate in the transistor 672.

The gate insulating film 662 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

As the gate electrode 654, a conductive film similar to the gate electrode 104 may be used.

The sidewall insulating film 660 may be formed of a single layer or a stacked layer using an insulating film containing one or more of aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The insulating film 668 may be formed using an insulating film similar to that of the protective insulating film 118. Alternatively, a resin film of a polyimide resin, an acrylic resin, an epoxy resin, a silicone resin, or the like may be used as the insulating film 668.

The insulating film 668 and the stacked-layer film 602 include an opening reaching the gate electrode 654 of the transistor 672. The drain electrode 616b of the transistor 671 is in contact with the gate electrode 654 of the transistor 672 through the opening.

The capacitor 673 includes an electrode 626 in contact with the wiring 624b; an electrode 628 overlapping with the electrode 626; and an insulating film 622 sandwiched between the electrode 626 and the electrode 628.

As the electrode 626, a conductive film similar to the electrode 526 may be used.

As the electrode 628, a conductive film similar to the electrode 528 may be used.

Here, the wiring 624a in FIG. 18C is electrically connected to the source line 674 in FIG. 18A. The gate electrode 604 in FIG. 18C is electrically connected to the word line 676 in FIG. 18A. The electrode 628 in FIG. 18C is electrically connected to the capacitor line 678 in FIG. 18A.

In the example of FIG. 18C, the transistor 671 and the capacitor 673 are provided in different layers so as to overlap with each other; however, one embodiment of the present invention is not limited to this structure. For example, the transistor 671 and the capacitor 673 may be provided in the same layer. With such a structure, memory cells having similar structures can be disposed so as to overlap with each other, in which case, a large number of memory cells can be integrated in an area for one memory cell. Accordingly, the degree of integration of the semiconductor device can be improved.

Here, with the use of the transistor including an oxide semiconductor film in the above embodiment as the transistor 671, a charge accumulated in the node 679 can be prevented from leaking through the transistor 671 because the off-state current of the transistor is extremely small. Therefore, data can be held for a long period. Further, a voltage for writing data does not need to be high as compared to the case of a flash memory; thus, power consumption can be made lower and operation speed can be made higher.

As described above, according to one embodiment of the present invention, a semiconductor device including a memory element with high degree of integration and low power consumption can be provided.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

Embodiment 4

A central processing unit (CPU) can be formed using any of the transistors and the semiconductor devices described in any of the above embodiments for at least part of the CPU.

Figure 19A:
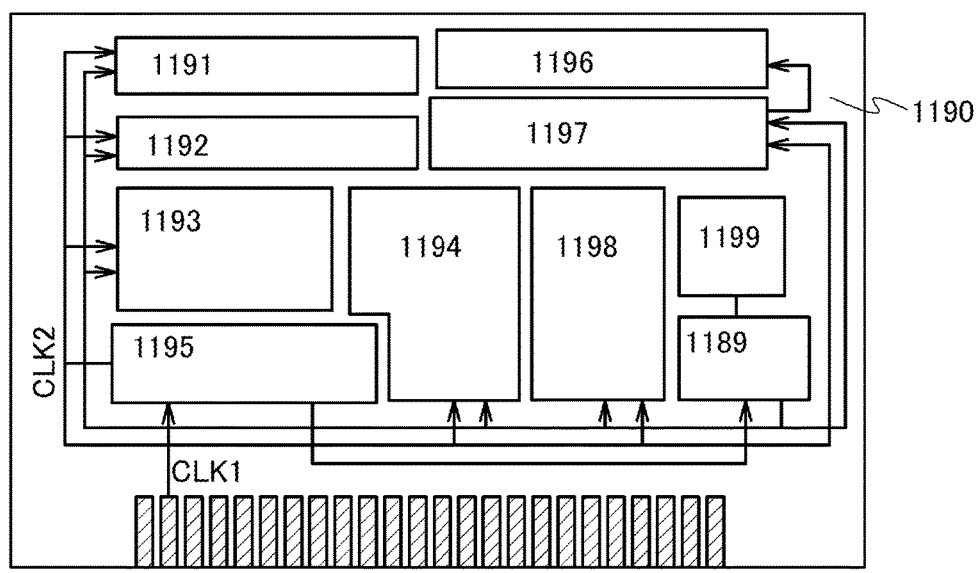
FIGS. 19A to 19C are block diagrams illustrating a structure of a CPU according to one embodiment of the present invention.

FIG. 19A is a block diagram illustrating a specific structure of the CPU. The CPU illustrated in FIG. 19A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 19A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 determines an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 19A, a memory element is provided in the register 1196. For the register 1196, any of the semiconductor devices described in the above embodiment can be used.

In the CPU illustrated in FIG. 19A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 19B:
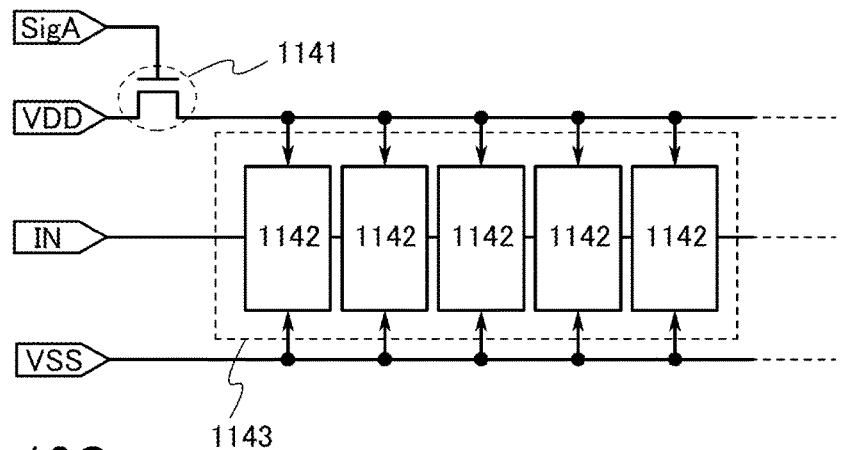
Figure 19C:
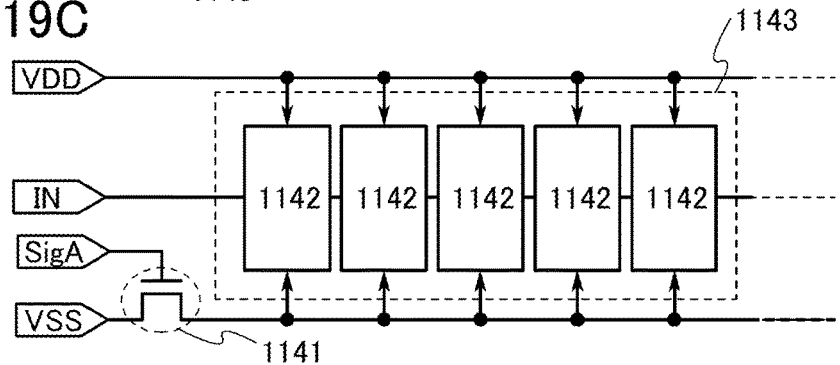

A switching element provided between a memory element group and a node to which a power supply potential VDD or a power supply potential VSS is supplied, as illustrated in FIG. 19B or FIG. 19C, allows the power supply voltage to be stopped. Circuits illustrated in FIGS. 19B and 19C will be described below.

FIGS. 19B and 19C each illustrate an example of a structure including any of the transistors described in the above embodiment as a switching element for controlling supply of a power supply potential to a memory element.

The memory device illustrated in FIG. 19B includes a switching element 1141 and a memory element group 1143 including a plurality of memory elements 1142. Specifically, as each of the memory elements 1142, the semiconductor device described in the above embodiment can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 19B, as the switching element 1141, the transistor in which off-state current is extremely small shown in the above embodiments is used. The switching of the transistor is controlled by a signal SigA input to the gate thereof.

Note that FIG. 19B illustrates the structure in which the switching element 1141 includes only one transistor; however, one embodiment of the present invention is not limited thereto. The switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 19C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor and the semiconductor memory device can also be applied to an LSI such as a digital signal processor (DSP), a custom LSI, or a field programmable gate array (FPGA).

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

Embodiment 5

In this embodiment, a display device to which any of the transistors described in the above embodiment is applied will be described.

As a display element provided in the display device, a liquid crystal element (also referred to as liquid crystal display element) or a light-emitting element (also referred to as light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used as the display element. In this embodiment, a display device using an EL element and a display device using a liquid crystal element will be described as examples of the display device.

Note that the display device in this embodiment includes a panel in which a display element is sealed and a module in which an IC and the like including a controller are mounted on the panel.

The display device in this embodiment means an image display device, a display device, or a light source (including a lighting device). Furthermore, the display device also includes the following modules: a module to which a connector such as an FPC or a TCP is attached; a module having a TCP at the tip of which a printed wiring board is provided; and a module in which an integrated circuit (IC) is directly mounted on a display element by a COG method.

Figure 20A:
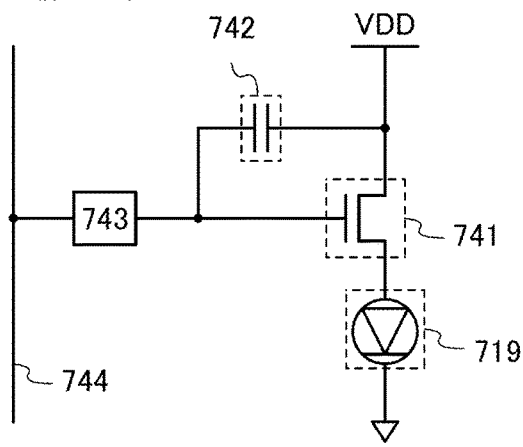
FIGS. 20A to 20C are a circuit diagram, a cross-sectional view of part of a pixel, and a cross-sectional view of a light-emitting layer of a display device including an EL element according to one embodiment of the present invention.

FIG. 20A illustrates an example of a circuit diagram of a display device using an EL element.

The display device illustrated in FIG. 20A includes a switch element 743, a transistor 741, a capacitor 742, and a light-emitting element 719.

A gate of the transistor 741 is electrically connected to one terminal of the switch element 743 and one terminal of the capacitor 742. A source of the transistor 741 is electrically connected to one terminal of the light-emitting element 719. A drain of the transistor 741 is electrically connected to the other terminal of the capacitor 742, and is supplied with a power supply potential VDD. The other terminal of the switch element 743 is electrically connected to a signal line 744. The other terminal of the light-emitting element 719 is supplied with a fixed potential. Note that the fixed potential is lower than or equal to a ground potential GND.

Note that, as the transistor 741, any of the transistors described in the above embodiments is used. The transistor has stable electrical characteristics. Therefore, a display device having stable display quality can be obtained.

As the switch element 743, a transistor is preferably used. With the use of the transistor as the switch element 743, the area of a pixel can be reduced, and the resolution of the display device can be improved. Note that as the switch element 743, any of the transistors described in the above embodiment may be used, in which case the switch element 743 can be manufactured through the same process as the transistor 741; thus, the productivity in manufacturing display devices can be improved.

Figure 20B:
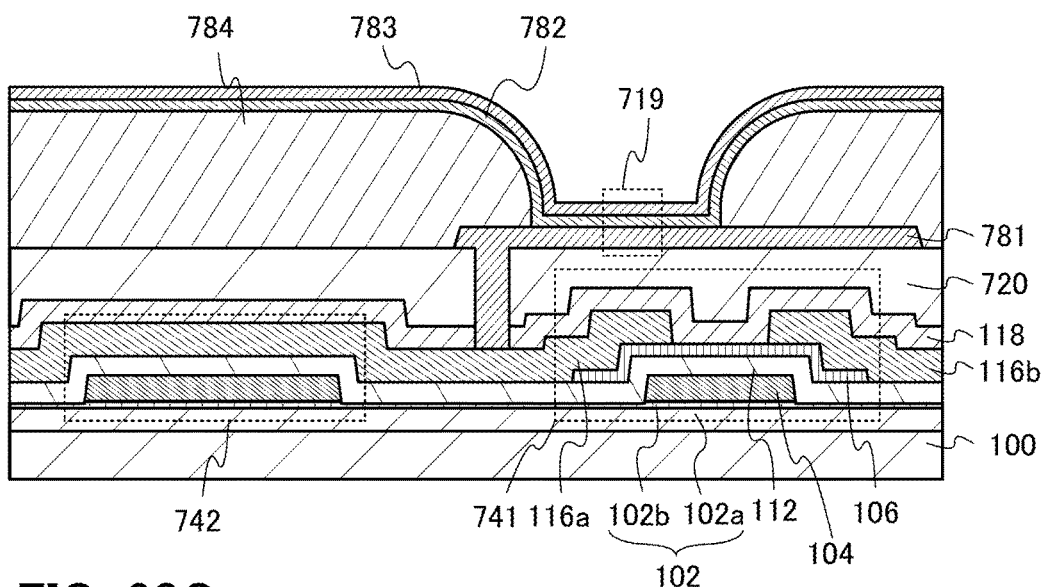

FIG. 20B illustrates part of a cross section of a pixel including the transistor 741, the capacitor 742, and the light-emitting element 719.

Note that FIG. 20B shows an example where the transistor 741 and the capacitor 742 are provided in the same plane. With such a structure, the capacitor 742 can be formed in the same layer and using the same film as a gate electrode, a gate insulating film, and a source electrode (drain electrode), which are included in the transistor 741. When the transistor 741 and the capacitor 742 are provided in the same plane in this manner, the number of manufacturing steps of the display device can be reduced; thus, the productivity can be increased.

In FIG. 20B, the transistor illustrated in FIGS. 2A to 2C is used as a transistor 741. Therefore, for components of the transistor 741, which are not particularly mentioned below, the description in the above embodiments is referred to.

An insulating film 720 is provided over the transistor 741 and the capacitor 742.

Here, an opening reaching the source electrode 116a of the transistor 741 is provided in the insulating film 720 and the protective insulating film 118.

An electrode 781 is provided over the insulating film 720. The electrode 781 is connected to the source electrode 116a of the transistor 741 through an opening provided in the insulating film 720 and the protective insulating film 118.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

The insulating film 720 may be formed using an insulating film similar to that of the protective insulating film 118. Alternatively, a resin film of a polyimide resin, an acrylic resin, an epoxy resin, a silicone resin, or the like may be used.

Figure 20C:
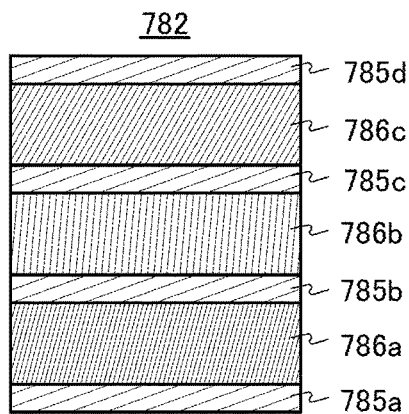

The light-emitting layer 782 is not limited to a single layer, and may be a stack of a plurality of kinds of light-emitting materials. For example, a structure illustrated in FIG. 20C may be employed. FIG. 20C illustrates the structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In this case, when materials emitting light of appropriate colors are used for the light-emitting layer 786a, the light-emitting layer 786b, and the light-emitting layer 786c, the light-emitting element 719 with a high color rending property or high emission efficiency can be formed.

White light may be obtained by stacking a plurality of kinds of light-emitting materials. Although not illustrated in FIG. 20B, white light may be extracted through coloring layers.

Although the structure in which three light-emitting layers and four intermediate layers are provided is shown here, the number of light-emitting layers and the number of intermediate layers can be changed as appropriate. For example, the light-emitting layer 782 can be formed with only the intermediate layer 785*a*, the light-emitting layer 786*a*, the intermediate layer 785*b*, the light-emitting layer 786*b*, and the intermediate layer 785*c*. Alternatively, the light-emitting layer 782 may be formed with the intermediate layer 785*a*, the light-emitting layer 786*a*, the intermediate layer 785*b*, the light-emitting layer 786*b*, the light-emitting layer 786*c*, and the intermediate layer 785*d*, and the intermediate layer 785*c* may be omitted.

Further, the intermediate layer may have a stacked-layer structure including any of a hole-injection layer, a hole-transport layer, an electron-transport layer, an electron-injection layer, and the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 may be formed using a conductive film having a transmitting property with respect to visible light. The phrase "having a transmitting property with respect to visible light" means that the average transmittance of light in a visible light region (for example, a wavelength range from 400 nm to 800 nm) is higher than or equal to 70%, particularly higher than or equal to 80%.

As the electrode 781, for example, an oxide film such as an In—Zn—W-based oxide film, an In—Sn-based oxide film, an In—Zn-based oxide film, an In-based oxide film, a Zn-based oxide film, or a Sn-based oxide film may be used. The above oxide film may contain a minute amount of Al, Ga, Sb, F, or the like. Further, a metal thin film having a thickness small enough to transmit light (preferably, approximately 5 nm to 30 nm) can also be used. For example, an Ag film, an Mg film, or an Ag—Mg alloy film with a thickness of 5 nm may be used.

The electrode 781 is preferably a film which efficiently reflects visible light. For example, a film containing lithium, aluminum, titanium, magnesium, lanthanum, silver, silicon, or nickel may be used as the electrode 781.

The electrode 783 can be formed using any of the films for the electrode 781. Note that when the electrode 781 has a transmitting property with respect to visible light, it is preferable that the electrode 783 efficiently reflect visible light. When the electrode 781 efficiently reflects visible light, it is preferable that the electrode 783 have a transmitting property with respect to visible light.

Positions of the electrode 781 and the electrode 783 are not limited to the structure illustrated in FIG. 20B, and the electrode 781 and the electrode 783 may be replaced with each other. It is preferable to use a conductive film having a high work function for the electrode which functions as an anode, and a conductive film having a low work function for the electrode which functions as a cathode. Note that in the case where a carrier generation layer is provided in contact with the anode, a variety of conductive films can be used for the anode regardless of their work functions.

The partition 784 may be formed using an insulating film similar to that of the protective insulating film 118. Alternatively, a resin film of a polyimide resin, an acrylic resin, an epoxy resin, a silicone resin, or the like may be used.

The transistor 741 connected to the light-emitting element 719 has stable electrical characteristics. Therefore, a display device having stable display quality can be obtained.

Next, a display device using a liquid crystal element will be described.

Figure 21A:
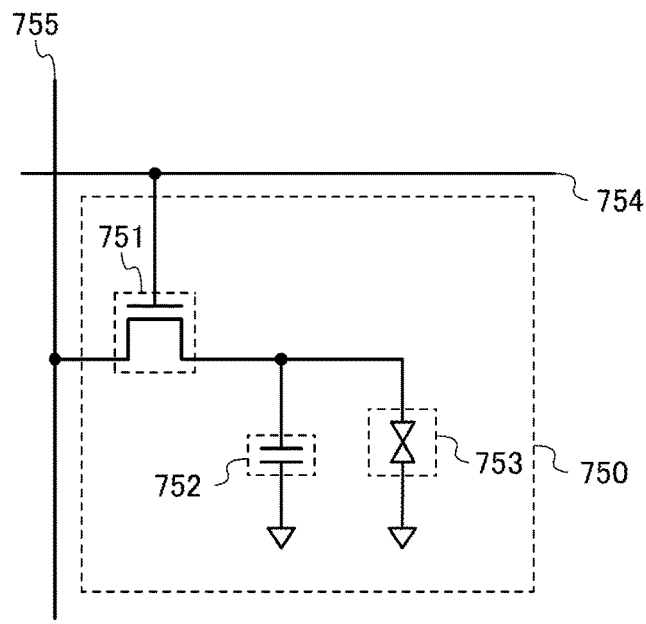
FIGS. 21A and 21B are a circuit diagram and a cross-sectional view of a pixel of a display device including a liquid crystal element, according to one embodiment of the present invention.

FIG. 21A is a circuit diagram illustrating a structure example of a pixel of a display device using a liquid crystal element. A pixel 750 in FIG. 21A includes a transistor 751, a capacitor 752, and an element in which a liquid crystal is filled between a pair of electrodes (hereinafter also referred to as a liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring electrically connected to the other of the electrodes of the capacitor 752.

Figure 21B:
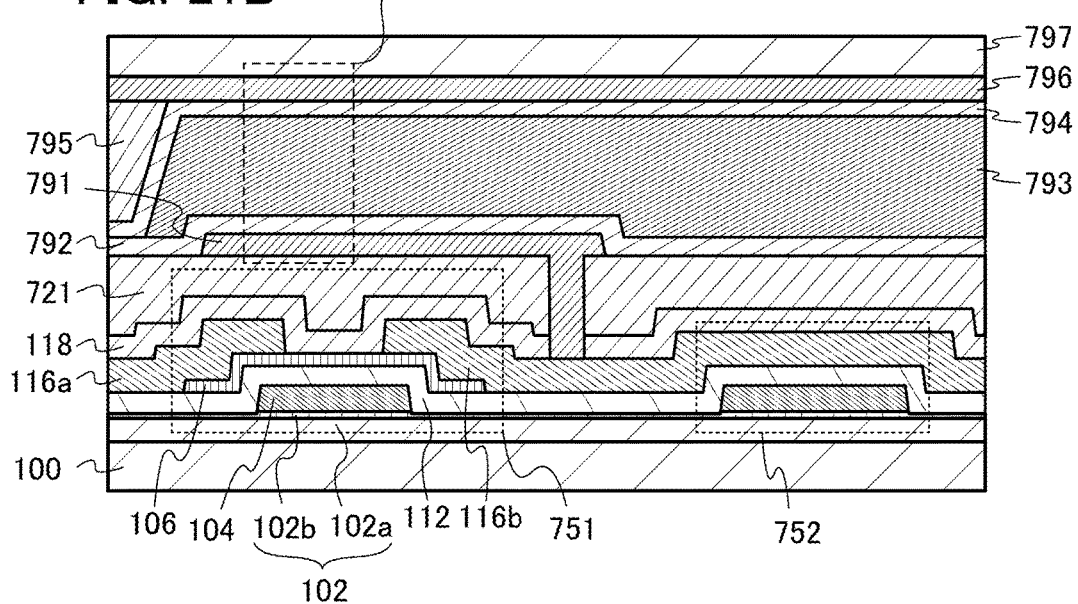

FIG. 21B illustrates part of a cross section of the pixel 750.

Note that FIG. 21B shows an example where the transistor 751 and the capacitor 752 are provided in the same plane. With such a structure, the capacitor 752 can be formed in the same layer and using the same film as a gate electrode, a gate insulating film, and a source electrode (drain electrode), which are included in the transistor 751. When the transistor 751 and the capacitor 752 are provided in the same plane in this manner, the number of manufacturing steps of the display device can be reduced; thus, the productivity can be increased.

As the transistor 751, any of the transistors described in the above embodiment can be used. In the example of FIG. 21B, the transistor illustrated in FIGS. 2A to 2C is used. Therefore, for components of the transistor 751 which are not particularly described below, refer to the description in the above embodiment.

Note that the off-state current of the transistor 751 can be extremely small. Consequently, a charge held in the capacitor 752 is unlikely to leak, and a voltage applied to the liquid crystal element 753 can be kept for a long period. Therefore, by turning off the transistor 751 when an image with little motion or a still image is displayed, an electrode for operating the transistor 751 is unnecessary. As a result, the power consumption of the display device can be lower.

An insulating film 721 is provided over the transistor 751 and the capacitor 752.

Here, an opening reaching the drain electrode 116*b* of the transistor 751 is provided in the insulating film 721 and the protective insulating film 118.

An electrode 791 is provided over the insulating film 721. The electrode 791 is in contact with the drain electrode 116*b* of the transistor 751 through the opening provided in the insulating film 721 and the protective insulating film 118.

Over the electrode 791, an insulating film 792 functioning as an alignment film is provided.

A liquid crystal layer 793 is provided over the insulating film 792.

An insulating film 794 functioning as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

The insulating film 721 may be formed using an insulating film similar to that of the protective insulating film 118. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like may be used. Such a liquid crystal exhibits a cholesteric phase, a smectic phase, a cubic phase, a chiral nematic phase, an isotropic phase, or the like depending on conditions.

For the liquid crystal layer 793, a liquid crystal exhibiting a blue phase may be used. In that case, the insulating films 792 and 794 functioning as the alignment films are not necessarily provided.

The electrode 791 may be formed using a conductive film having a transmitting property with respect to visible light.

As the electrode 791, for example, an oxide film such as an In—Zn—W-based oxide film, an In—Sn-based oxide film, an In—Zn-based oxide film, an In-based oxide film, a Zn-based oxide film, or a Sn-based oxide film may be used. The above oxide film may contain a minute amount of Al, Ga, Sb, F, or the like. Further, a metal thin film having a thickness small enough to transmit light (preferably, approximately 5 nm to 30 nm) can also be used.

The electrode 791 is preferably a film which efficiently reflects visible light. For example, a film containing aluminum, titanium, chromium, copper, molybdenum, silver, tantalum, or tungsten may be used as the electrode 791.

The electrode 796 can be formed using any of the films for the electrode 791. Note that when the electrode 791 has a transmitting property with respect to visible light, it is preferable that the electrode 796 efficiently reflect visible light. When the electrode 791 efficiently reflects visible light, it is preferable that the electrode 796 have a transmitting property with respect to visible light.

Positions of the electrode 791 and the electrode 796 are not limited to the structure illustrated in FIG. 21B, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

For the substrate 797, a glass, a resin, a metal, or the like may be used. The substrate 797 may be a flexible substrate.

The transistor 751 connected to the liquid crystal element 753 has stable electrical characteristics. Therefore, a display device having stable display quality can be obtained. Further, the transistor 751 with an extremely low off-state current is used, whereby a display device with low power consumption can be provided.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

Embodiment 6

In this embodiment, examples of an electronic device to which any of the semiconductor devices described in the above embodiment is applied will be described.

Figure 22A:
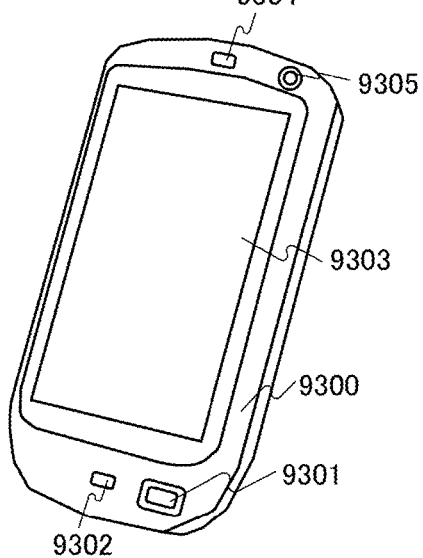
FIGS. 22A to 22D are diagrams illustrating electronic devices according to one embodiment of the present invention.

FIG. 22A illustrates a portable information terminal. The portable information terminal illustrated in FIG. 22A includes a housing 9300, a button 9301, a microphone 9302, a display portion 9303, a speaker 9304, and a camera 9305, and has a function as a mobile phone. One embodiment of the present invention can be applied to an arithmetic unit, a wireless circuit, or a memory circuit in a main body. One embodiment of the present invention can also be applied to the display portion 9303.

Figure 22B:
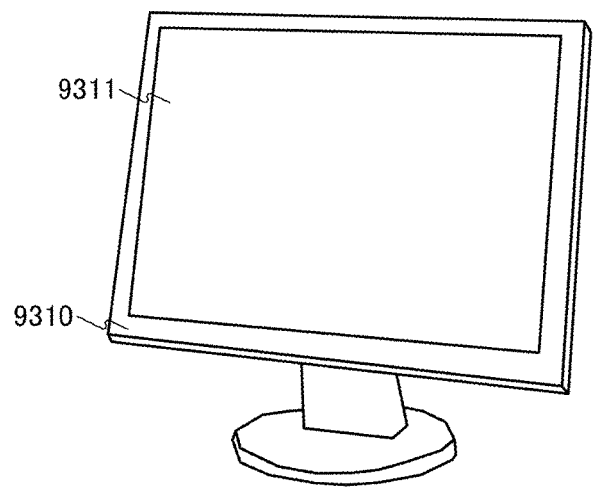

FIG. 22B illustrates a display, which includes a housing 9310 and a display portion 9311. One embodiment of the present invention can be applied to an arithmetic unit, a wireless circuit, or a memory circuit in a main body. One embodiment of the present invention can also be applied to the display portion 9311.

Figure 22C:
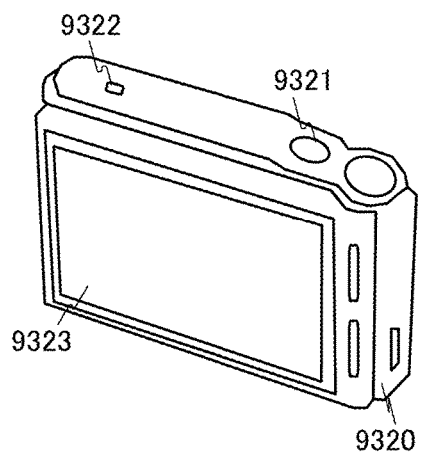

FIG. 22C illustrates a digital still camera. The digital still camera illustrated in FIG. 22C includes a housing 9320, a button 9321, a microphone 9322, and a display portion 9323. One embodiment of the present invention can be applied to an arithmetic unit, a wireless circuit, or a memory circuit in a main body. One embodiment of the present invention can also be applied to the display portion 9323.

Figure 22D:
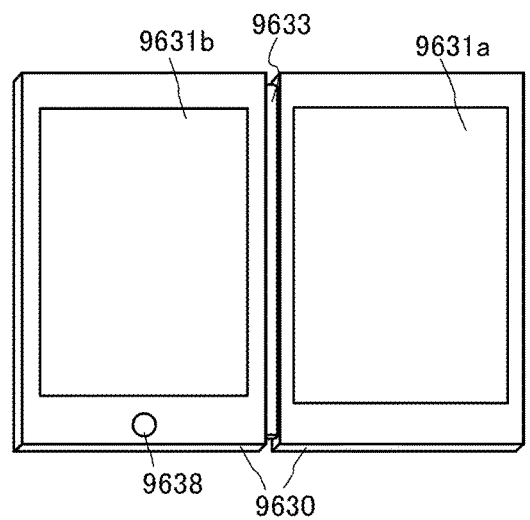

FIG. 22D illustrates a double-foldable portable information terminal. The double-foldable portable information terminal illustrated in FIG. 22D includes a housing 9630, a display portion 9631*a*, a display portion 9631*b*, a hinge 9633, and an operation switch 9638. One embodiment of the present invention can be applied to an arithmetic unit, a wireless circuit, or a memory circuit in a main body. One embodiment of the present invention can also be applied to the display portion 9631*a* and the display portion 9631*b*.

Part or the whole of the display portion 9631*a* and/or the display portion 9631*b* can function as a touch panel. By touching an operation key displayed on the touch panel, a user can input data, for example.

With the use of a semiconductor device according to one embodiment of the present invention, an electronic device with stable operation and low power consumption can be provided.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

Note that, in this specification and the like, part of a diagram or a text described in one embodiment can be taken out to constitute one embodiment of the invention. Thus, in the case where a diagram or a text related to a certain part is described, a content taken out from a diagram or a text of the certain part is also disclosed as one embodiment of the invention and can constitute one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that, in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention and can constitute one embodiment of the invention.

Note that, in this specification and the like, a content described in at least a diagram (which may be part of the diagram) is disclosed as one embodiment of the invention and can constitute one embodiment of the invention. Therefore, when a certain content is described in a diagram, the content is disclosed as one embodiment of the invention even without text description and can constitute one embodiment of the invention. Similarly, a diagram obtained by taking out part of a diagram is disclosed as one embodiment of the invention and can constitute one embodiment of the invention.

This application is based on Japanese Patent Application serial no. 2012-086279 filed with Japan Patent Office on Apr. 5, 2012, the entire contents of which are hereby incorporated by reference.

What is claimed is:

1. A semiconductor device comprising:
   a stacked-layer film as a base film comprising an oxide insulating film over a substrate and a metal oxide film over the oxide insulating film;
   a gate electrode over and in contact with the metal oxide film;
   a gate insulating film over the gate electrode; and
   an oxide semiconductor film over the gate insulating film, wherein the metal oxide film contains oxygen,
   wherein a thickness of the metal oxide film is greater than or equal to 3 nm and less than or equal to 15 nm,
   wherein the oxide insulating film contains oxygen in excess of a stoichiometric composition,
   wherein the stacked-layer film is configured to release oxygen by a heat treatment,
   wherein the metal oxide film comprises a first region in contact with the gate electrode and a second region in contact with the gate insulating film, and
   wherein a thickness of the first region is larger than a thickness of the second region.

2. The semiconductor device according to claim 1, wherein the oxide semiconductor film contains indium, gallium, and zinc.

3. The semiconductor device according to claim 1, further comprising a source electrode and a drain electrode connected to the oxide semiconductor film.

4. The semiconductor device according to claim 1, wherein an average surface roughness of the metal oxide film is less than or equal to 0.1 nm.

5. The semiconductor device according to claim 1, wherein the metal oxide film allows oxygen to permeate therethrough.

6. The semiconductor device according to claim 1, wherein the metal oxide film further contains one of magnesium, vanadium, chromium, yttrium, zirconium, niobium, lanthanum, cerium, neodymium, hafnium, tantalum, and tungsten.

7. A semiconductor device comprising:
   a stacked-layer film as a base film comprising an oxide insulating film over a substrate and a metal oxide film over the oxide insulating film;
   a gate electrode over and in contact with the metal oxide film;
   a gate insulating film over the gate electrode; and
   an oxide semiconductor film over the gate insulating film, wherein the metal oxide film contains oxygen and aluminum,
   wherein a thickness of the metal oxide film is greater than or equal to 3 nm and less than or equal to 15 nm,
   wherein the oxide insulating film contains oxygen in excess of a stoichiometric composition,
   wherein the stacked-layer film is configured to release oxygen by a heat treatment,
   wherein the metal oxide film comprises a first region in contact with the gate electrode and a second region in contact with the gate insulating film, and
   wherein a thickness of the first region is larger than a thickness of the second region.

8. The semiconductor device according to claim 7, wherein the oxide semiconductor film contains indium, gallium, and zinc.

9. The semiconductor device according to claim 7, further comprising a source electrode and a drain electrode connected to the oxide semiconductor film.

10. The semiconductor device according to claim 7, wherein an average surface roughness of the metal oxide film is less than or equal to 0.1 nm.

11. A semiconductor device comprising:
    a stacked-layer film as a base film comprising an oxide insulating film over a substrate and a metal oxide film over the oxide insulating film;
    a first gate electrode over and in contact with the metal oxide film;
    a first gate insulating film over the first gate electrode;
    an oxide semiconductor film over the first gate insulating film;
    a second gate insulating film over the oxide semiconductor film; and
    a second gate electrode over the second gate insulating film,
    wherein the metal oxide film contains oxygen,
    wherein a thickness of the metal oxide film is greater than or equal to 3 nm and less than or equal to 15 nm,
    wherein the oxide insulating film contains oxygen in excess of a stoichiometric composition,
    wherein the stacked-layer film is configured to release oxygen by a heat treatment,
    wherein the metal oxide film comprises a first region in contact with the first gate electrode and a second region in contact with the first gate insulating film, and wherein a thickness of the first region is larger than a thickness of the second region.

12. The semiconductor device according to claim 11, wherein the oxide semiconductor film contains indium, gallium, and zinc.

13. The semiconductor device according to claim 11, further comprising a source electrode and a drain electrode connected to the oxide semiconductor film.

14. The semiconductor device according to claim 11, wherein an average surface roughness of the metal oxide film is less than or equal to 0.1 nm.

15. The semiconductor device according to claim 11, wherein the metal oxide film further contains aluminum.

* * * * *